US 9,444,426 B2

(12) United States Patent
Burak et al.

(10) Patent No.: US 9,444,426 B2
(45) Date of Patent: Sep. 13, 2016

(54) ACCOUSTIC RESONATOR HAVING INTEGRATED LATERAL FEATURE AND TEMPERATURE COMPENSATION FEATURE

(71) Applicant: Avago Technologies General IP (Singapore) Pte. Ltd., Singapore (SG)

(72) Inventors: Dariusz Burak, Fort Collins, CO (US); John Choy, Westminster, CO (US); Phil Nikkel, Loveland, CO (US); Kevin J. Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 313 days.

(21) Appl. No.: 13/766,993

(22) Filed: Feb. 14, 2013

(65) Prior Publication Data

US 2014/0118092 A1    May 1, 2014

Related U.S. Application Data

(63) Continuation-in-part of application No. 13/660,941, filed on Oct. 25, 2012.

(51) Int. Cl.
*H03H 9/13*    (2006.01)
*H03H 9/15*    (2006.01)
(Continued)

(52) U.S. Cl.
CPC ..... *H03H 9/02086* (2013.01); *H03H 9/02102* (2013.01); *H03H 9/131* (2013.01); *H03H 9/132* (2013.01); *H03H 9/173* (2013.01); *H03H 9/175* (2013.01)

(58) Field of Classification Search
CPC ........... H03H 9/02102; H03H 9/0211; H03H 9/02118; H03H 9/131; H03H 9/171; H03H 9/173; H03H 9/175; H03H 9/54; H03H 9/587; H03H 9/589; H03H 9/02086; H03H 9/132
USPC ................................. 333/187, 189; 310/346
See application file for complete search history.

(56) References Cited

U.S. PATENT DOCUMENTS 3,174,122 A    3/1965 Fowler et al.
3,189,851 A    6/1965 Fowler
(Continued)

FOREIGN PATENT DOCUMENTS

CN    101170303    9/2011
DE    10160617    6/2003
(Continued)

OTHER PUBLICATIONS

Zou et al.; "High Coupling Coefficient Temperature Compensated FBAR Resonator for Oscillator Application with Wide Pulling Range"; 2010 IEEE International Frequency Control Symposium (FCS), Jun. 1-4, 2010, pp. 646-651 and one page IEEE Xplore abstract.*

(Continued)

*Primary Examiner* — Barbara Summons

(57) ABSTRACT

A bulk acoustic wave (BAW) resonator device includes a bottom electrode on a substrate over one of a cavity and an acoustic mirror, a piezoelectric layer on the bottom electrode, a top electrode on the piezoelectric layer, and a temperature compensation feature having positive temperature coefficient for offsetting at least a portion of a negative temperature coefficient of the piezoelectric layer. At least one of the bottom electrode and the top electrode includes an integrated lateral feature configured to create at least one of a cut-off frequency mismatch and an acoustic impedance mismatch.

7 Claims, 13 Drawing Sheets

(51) Int. Cl.
 *H03H 9/54* (2006.01)
 *H03H 9/02* (2006.01)
 *H03H 9/17* (2006.01)

(56) References Cited

U.S. PATENT DOCUMENTS

| | | |
|---|---|---|
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A * | 6/1984 | Inoue et al. ............... 310/324 |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,291,931 B1 | 9/2001 | Lakin |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,679 B1 | 5/2002 | Lorenz |
| 6,384,697 B1 | 5/2002 | Ruby |
| 6,396,200 B2 * | 5/2002 | Misu et al. ............... 310/348 |
| 6,407,649 B1 | 6/2002 | Tikka et al. |
| 6,414,569 B1 | 7/2002 | Nakafuku |
| 6,420,820 B1 * | 7/2002 | Larson, III ............... 310/346 |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |

(56) References Cited

U.S. PATENT DOCUMENTS

| | | |
|---|---|---|
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,054 B2 | 4/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,650,205 B2 | 11/2003 | Goetz et al. |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,709,776 B2 | 3/2004 | Noguchi et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,787,897 B2 | 9/2004 | Geefay et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,864,619 B2 | 3/2005 | Aigner et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson |
| 6,888,424 B2 | 5/2005 | Takeuchi et al. |
| 6,894,588 B2 | 5/2005 | Detlefsen |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,919,222 B2 | 7/2005 | Geefay |
| 6,924,583 B2 | 8/2005 | Lin et al. |
| 6,924,717 B2 | 8/2005 | Ginsburg et al. |
| 6,927,651 B2 | 8/2005 | Larson et al. |
| 6,933,809 B2 | 8/2005 | Kyoung et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,979,597 B2 | 12/2005 | Geefay et al. |
| 6,985,051 B2 | 1/2006 | Nguyen et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,161,283 B1 | 1/2007 | Geefay |
| 7,161,448 B2 | 1/2007 | Feng et al. |
| 7,170,215 B2 | 1/2007 | Namba et al. |
| 7,173,504 B2 | 2/2007 | Larson et al. |
| 7,179,392 B2 | 2/2007 | Robert et al. |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,235,462 B2 | 6/2007 | Letertre et al. |
| 7,242,270 B2 | 7/2007 | Larson et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson et al. |
| 7,345,409 B2 | 3/2008 | Leidl et al. |
| 7,345,410 B2 | 3/2008 | Grannen et al. |
| 7,358,831 B2 | 4/2008 | Larson, III et al. |
| 7,367,095 B2 | 5/2008 | Larson et al. |
| 7,368,857 B2 | 5/2008 | Tanaka |
| 7,369,013 B2 * | 5/2008 | Fazzio et al. ............... 333/187 |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson |
| 7,391,286 B2 | 6/2008 | Jamneala et al. |
| 7,400,217 B2 | 7/2008 | Larson et al. |

(56) References Cited

U.S. PATENT DOCUMENTS

| | | |
|---|---|---|
| 7,408,428 B2 | 8/2008 | Larson |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson et al. |
| 7,425,787 B2 | 9/2008 | Larson |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 | 1/2009 | Yamada et al. |
| 7,486,213 B2 | 2/2009 | Yu et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,563,475 B2 | 7/2009 | Ruby et al. |
| 7,567,023 B2 | 7/2009 | Iwaki et al. |
| 7,575,292 B2 | 8/2009 | Furukawa |
| 7,576,471 B1 | 8/2009 | Solal |
| 7,602,101 B2 | 10/2009 | Hara et al. |
| 7,602,102 B1 | 10/2009 | Barber et al. |
| 7,619,493 B2 | 11/2009 | Uno et al. |
| 7,629,865 B2 | 12/2009 | Ruby |
| 7,636,026 B2 | 12/2009 | Heinze et al. |
| 7,649,304 B2 | 1/2010 | Umeda et al. |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,737,807 B2 | 6/2010 | Larson et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,893,793 B2 | 2/2011 | Iwasaki et al. |
| 7,978,025 B2 | 7/2011 | Yokoyama et al. |
| 7,986,198 B2 | 7/2011 | Nakatsuka et al. |
| 8,008,993 B2 | 8/2011 | Milsom et al. |
| 8,030,823 B2 | 10/2011 | Sinha et al. |
| 8,084,919 B2 | 12/2011 | Nishihara et al. |
| 8,222,795 B2 | 7/2012 | Sinha et al. |
| 8,232,845 B2 | 7/2012 | Ruby et al. |
| 8,253,513 B2 | 8/2012 | Zhang |
| 8,330,325 B1 | 12/2012 | Burak et al. |
| 8,384,497 B2 | 2/2013 | Zhang |
| 8,456,257 B1 | 6/2013 | Fattinger |
| 8,575,820 B2 | 11/2013 | Shirakawa et al. |
| 9,069,005 B2 | 6/2015 | Ruby |
| 9,099,983 B2 | 8/2015 | Burak et al. |
| 9,136,819 B2 | 9/2015 | Grannen et al. |
| 9,154,112 B2 | 10/2015 | Burak |
| 9,223,248 B2 | 12/2015 | Kawano et al. |
| 9,225,313 B2 | 12/2015 | Bradley et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson et al. |
| 2002/0153965 A1 | 10/2002 | Ruby et al. |
| 2002/0158716 A1 | 10/2002 | Pensala |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0213964 A1 | 11/2003 | Flynn et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0046622 A1 | 3/2004 | Aigner et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0188241 A1 | 9/2004 | Rich et al. |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093397 A1 | 5/2005 | Yamada et al. |
| 2005/0093653 A1 | 5/2005 | Larson |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson et al. |
| 2005/0110598 A1* | 5/2005 | Larson, III ............ 333/191 |
| 2005/0128030 A1 | 6/2005 | Larson et al. |
| 2005/0140466 A1 | 6/2005 | Larson et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0038636 A1 | 2/2006 | Tsurumi et al. |
| 2006/0071736 A1 | 4/2006 | Ruby et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemmer et al. |
| 2006/0176126 A1 | 8/2006 | Wang et al. |
| 2006/0185139 A1 | 8/2006 | Larson et al. |
| 2006/0197411 A1 | 9/2006 | Hoen et al. |
| 2006/0238070 A1 | 10/2006 | Costa et al. |
| 2006/0284706 A1 | 12/2006 | Ginsburg et al. |
| 2006/0284707 A1 | 12/2006 | Larson et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0040473 A1 | 2/2007 | Ballandras et al. |

(56) References Cited

U.S. PATENT DOCUMENTS

| | | |
|---|---|---|
| 2007/0069225 A1 | 3/2007 | Krames et al. |
| 2007/0080759 A1 | 4/2007 | Jamneala et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0266548 A1 | 11/2007 | Fattinger |
| 2007/0279153 A1 | 12/2007 | Ruby |
| 2008/0042780 A1 | 2/2008 | Lee et al. |
| 2008/0055020 A1 | 3/2008 | Handtmann et al. |
| 2008/0129417 A1 | 6/2008 | Taniguchi |
| 2008/0143215 A1 | 6/2008 | Hara et al. |
| 2008/0258842 A1 | 10/2008 | Ruby et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1 | 1/2009 | Umeda et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milsom et al. |
| 2009/0267453 A1 | 10/2009 | Barber et al. |
| 2009/0267457 A1 | 10/2009 | Barber et al. |
| 2010/0013573 A1 | 1/2010 | Umeda |
| 2010/0033063 A1 | 2/2010 | Nishihara et al. |
| 2010/0039000 A1 | 2/2010 | Milson et al. |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0111808 A1 | 5/2010 | Pimputkar et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0037539 A1 | 2/2011 | Jansman et al. |
| 2011/0084779 A1 | 4/2011 | Zhang |
| 2011/0121689 A1 | 5/2011 | Grannen et al. |
| 2011/0121916 A1 | 5/2011 | Barber et al. |
| 2011/0148547 A1* | 6/2011 | Zhang ............................ 333/187 |
| 2011/0180391 A1 | 7/2011 | Larson et al. |
| 2011/0204996 A1 | 8/2011 | Gilbert et al. |
| 2011/0204997 A1 | 8/2011 | Elbrecht et al. |
| 2011/0227671 A1* | 9/2011 | Zhang ............................ 333/195 |
| 2011/0266925 A1 | 11/2011 | Ruby et al. |
| 2012/0154074 A1 | 6/2012 | Ruby et al. |
| 2012/0161902 A1 | 6/2012 | Feng et al. |
| 2012/0177816 A1 | 7/2012 | Larson et al. |
| 2012/0194297 A1 | 8/2012 | Choy |
| 2012/0218055 A1 | 8/2012 | Burak et al. |
| 2012/0218056 A1 | 8/2012 | Burak |
| 2012/0218057 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0248941 A1 | 10/2012 | Shirakawa et al. |
| 2012/0280767 A1 | 11/2012 | Burak et al. |
| 2013/0033151 A1* | 2/2013 | Ueda et al. ................... 310/318 |
| 2013/0038408 A1 | 2/2013 | Burak et al. |
| 2013/0063227 A1 | 3/2013 | Burak et al. |
| 2013/0082799 A1 | 4/2013 | Zuo et al. |
| 2013/0106534 A1 | 5/2013 | Burak et al. |
| 2013/0127300 A1 | 5/2013 | Umeda et al. |
| 2013/0140959 A1 | 6/2013 | Shin et al. |
| 2013/0205586 A1 | 8/2013 | Takada et al. |
| 2013/0235001 A1 | 9/2013 | Yun et al. |
| 2013/0241673 A1 | 9/2013 | Yokoyama et al. |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118091 A1 | 5/2014 | Burak et al. |
| 2014/0118092 A1 | 5/2014 | Burak et al. |
| 2014/0159548 A1 | 6/2014 | Burak et al. |
| 2014/0224941 A1 | 8/2014 | Gitter et al. |
| 2014/0225682 A1 | 8/2014 | Burak et al. |
| 2014/0225683 A1 | 8/2014 | Burak et al. |

FOREIGN PATENT DOCUMENTS

| | | | |
|---|---|---|---|
| DE | 10239317 | | 3/2004 |
| DE | 102007012384 | | 9/2008 |
| EP | 231892 | | 8/1987 |
| EP | 0637875 | | 2/1995 |
| EP | 689254 | | 12/1995 |
| EP | 0865157 | | 9/1998 |
| EP | 880227 | | 12/1998 |
| EP | 1047189 | | 10/2000 |
| EP | 1096259 | | 5/2001 |
| EP | 1100196 | | 5/2001 |
| EP | 1180494 | | 2/2002 |
| EP | 1249932 | | 10/2002 |
| EP | 1258989 | | 11/2002 |
| EP | 1258990 | | 11/2002 |
| EP | 1517443 | | 3/2005 |
| EP | 1517444 | | 3/2005 |
| EP | 1528674 | | 5/2005 |
| EP | 1528675 | | 5/2005 |
| EP | 1528676 | | 5/2005 |
| EP | 1528677 | | 5/2005 |
| EP | 1542362 | | 6/2005 |
| EP | 1557945 | | 7/2005 |
| EP | 1575165 | | 9/2005 |
| EP | 0973256 | | 9/2006 |
| EP | 2299592 | | 3/2011 |
| EP | 2299593 | | 3/2011 |
| FR | 2951027 | | 4/2011 |
| GB | 1207974 | | 10/1970 |
| GB | 2013343 | | 8/1979 |
| GB | 2411239 | | 8/2005 |
| GB | 2418791 | | 4/2006 |
| GB | 2427773 | | 1/2007 |
| JP | 359023612 | | 2/1984 |
| JP | 60-16010 | * | 1/1985 |
| JP | 61054686 | | 3/1986 |
| JP | 6165507 | | 4/1986 |
| JP | 62-109419 | | 5/1987 |
| JP | 62-200813 | | 9/1987 |
| JP | 1-295512 | | 11/1989 |
| JP | 2-10907 | | 1/1990 |
| JP | 06005944 | | 1/1994 |
| JP | 8-330878 | | 12/1996 |
| JP | 09-027729 | | 1/1997 |
| JP | 9-83029 | | 3/1997 |
| JP | 10-32456 | | 2/1998 |
| JP | 10-308645 | | 11/1998 |
| JP | 2000-31552 | | 1/2000 |
| JP | 2000076295 | | 3/2000 |
| JP | 2000-232334 | | 8/2000 |
| JP | 2000-295065 | | 10/2000 |
| JP | 2000-332568 | | 11/2000 |
| JP | 2001-102901 | | 4/2001 |
| JP | 2001-508630 | | 6/2001 |
| JP | 2002/217676 | | 8/2002 |
| JP | 2003017964 | | 1/2003 |
| JP | 2003017974 | | 1/2003 |
| JP | 2003-505905 | | 2/2003 |
| JP | 2003124779 | | 4/2003 |
| JP | 2003-332872 | | 11/2003 |
| JP | 2005-159402 | | 6/2005 |
| JP | 2006-109472 | | 4/2006 |
| JP | 2006-295924 | | 10/2006 |
| JP | 2006-319796 | | 11/2006 |
| JP | 2007-006501 | | 1/2007 |
| JP | 2007/028669 | | 2/2007 |

(56) References Cited

FOREIGN PATENT DOCUMENTS

| JP | 2007-295306 | 11/2007 |
|---|---|---|
| JP | 2008-066792 | 3/2008 |
| JP | 4471443 | 6/2010 |
| JP | 2003-505906 | 9/2013 |
| WO | 98/16957 | 4/1998 |
| WO | 98/38736 | 9/1998 |
| WO | 98/56049 | 12/1998 |
| WO | 99-37023 | 7/1999 |
| WO | 01/06646 | 1/2001 |
| WO | 01/06647 | 1/2001 |
| WO | 0199276 | 12/2001 |
| WO | 02/103900 | 12/2002 |
| WO | 03/030358 | 4/2003 |
| WO | 03/043188 | 5/2003 |
| WO | 03/050950 | 6/2003 |
| WO | 03/058809 | 7/2003 |
| WO | 2004/034579 | 4/2004 |
| WO | 2004/051744 | 6/2004 |
| WO | 2004/102688 | 11/2004 |
| WO | 2005/043752 | 5/2005 |
| WO | 2005/043753 | 5/2005 |
| WO | 2005/043756 | 5/2005 |
| WO | 2006/018788 | 2/2006 |
| WO | WO2006079353 | 8/2006 |
| WO | 2007085332 | 8/2007 |
| WO | WO2013065488 | 5/2013 |

OTHER PUBLICATIONS

Zhang et al.; "MIMO Multiplexer Based on Film Bulk Acoustic Resonator"; IEEE Transactions on Consumer Electronics, vol. 56, No. 2, May 2010, pp. 805-810.*
U.S. Appl. No. 13/232,334, filed Sep. 14, 2011.
G.W. Archibald, "Experimental results of bulk acoustic wave transverse graded electrode patterns", Proceedings of the 1998 IEEE International Frequency Control Symposium, Publication Year: 1998 , pp. 477-483.
U.S. Appl. No. 13/660,941, filed Oct. 25, 2012.
Kerherve, "BAW Technologies for Radiofrequency Filters and Duplexers", Nov. 2011, pp. 1-89.
Lin, "Temperature Compensation of Aluminum Nitride Lamb Wave Resonators Utilizing the Lowest-Order Symmetric Mode", *Electrical Engineering and Computer Sciences University of California at Berkeley* Dec. 14, 2012, 94 pages.
Akiyama et al., "Enhancement of Piezoelectric Response in Scandium Aluminum Nitride Alloy Thin Films Prepared by Dual Reactive Co-Sputtering", Advanced Materials 2009, 21, pp. 593-596, copyright 2009 WILEY-VCH Veriag GmbH & Co. KGaA, Weinheim.
Moriera, "Aluminum Scandium Nitride Thin-Film Bulk Acoustic Resonators for Wide Band Applications", Vacuum 86 (2011) 23-26.
Machine Translation of WO02103900, published Dec. 27, 2002.
Machine Translation of WO03/030358, published Apr. 10, 2003.
Machine Translation of WO03/043188, published May 22, 2003.
Machine Translation of WO03/050950, published Jun. 19, 2003.
Machine Translation of CN101170303, published Sep. 14, 2011.
Machine Translation of DE10160617, published Jun. 12, 2003.
Machine Translation of DE102007012384, published Sep. 18, 2008.
Machine Translation of DE10239317, published Mar. 11, 2004.
Machine Translation of JP10308645, published Nov. 17, 1998.
Machine Translation of JP10-32456, published Feb. 3, 1998.
Machine Translation of JP2000076295, published Mar. 14, 2000.
Machine Translation of JP2000-232334, published Aug. 22, 2000.
Machine Translation of JP2000295065, published Oct. 20, 2000.
Machine Translation of JP2000-332568, published Nov. 30, 2000.
Machine Translation of JP2001-102901, published Apr. 13, 2001.
Machine Translation of JP2001-508630, published Jun. 26, 2001.
Machine Translation of JP2002/217676, published Aug. 2, 2002.
Machine Translation of JP2003017964, published Jan. 17, 2003.
Machine Translation of JP2003124779, published Apr. 25, 2003.
Machine Translation of JP2003017974, published Jan. 17, 2003.
Machine Translation of JP2003-332872, published Nov. 21, 2003.
Machine Translation of JP2003-505905, published Feb. 12, 2003.
Examination Report dated Aug. 25, 2006 for UK Application No. GB0605770.7.
Examination Report dated Aug. 24, 2006 for UK Application No. GB0605971.1.
Search Report dated Dec. 13, 2006 for UK Application No. GB0617742.2.
Search Report dated Jun. 26, 2006 for UK Application No. GB0605225.2.
Search Report dated Nov. 15, 2006 for UK Application No. GB0620152.9.
Search Report dated Nov. 15, 2006 for UK Application No. GB0620655.1.
Search Report dated Nov. 17, 2006 for UK Application No. GB0620653.6.
Search Report dated Nov. 23, 2006 for UK Application No. GB0620657.7.
Search Report dated Aug. 23, 2006 for UK Application No. GB0605779.8.
Search Report dated Nov. 30, 2006 for UK Application No. GB0619698.4.
Auld, "Acoustic Resonators Acoustic Fields and Waves in Solids", Second Edition, vol. II, 250-259, 1990.
BI, "Bulk Acoustic Wave RF Technology", IEEE Microwave Magazine, vol. 9, Issue 5. 65-80, 2008.
Chen, "Fabrication and Characterization of ALN Thin Film Bulk Acoustic Wave Resonator Dissertation", University of Pittsburgh School of Engineering, 2006.
Dubois, "Solidly Mounted Resonator Based On Aluminum Nitride Thin Film", 1998 IEEE Ultrasonics Symposium, vol. 1, 909-912, 1998.
El Hassan et al., "Techniques For Tuning BAW-SMR Resonators For The 4th Generation Of Mobile Communications Intech", 421-442, 2013.
Kaitila et al., "Measurement of Acoustical Parameters of Thin Films", 2006 IEEE Ultrasonics Symposium, 464-467, Oct. 2006.
Krishnaswamy et al., "Film Bulk Acoustic Wave Resonator Technology", 529-536, May 29, 1990.
Lakin, "Thin Film Resonators and Filters", IEEE Untrasonics Symposium, Caesar's Tahoe, NV, 895-906, Oct. 1999.
Larson et al., "Measurement of Effective Kt2,Q,Rp,Rs vs. Temperature for Mo/AIN FBAR Resonators", IEEE Ultrasonics Symposium, 939-943, 2002.
Lee et al., "Optimization of Frame-Like Film Bulk Acoustic Resonators for Suppression of Spurious Lateral Modes Using Finite Element Method", IEEE Ultrasonic Symposium, vol. 1, 278-281, 2004.
Pensala et al., "Spurious resonance supression in gigahertz-range ZnO thin-film bulk acoustic wave resonators by the boundary frame method: modeling and experiment", IEEE Transactions on Ultrasonics, Ferroelectrics, and Frequency Control, vol. 56, No. 8, 1731-1744, Aug. 2009.
Pensala, "Thin Film Bulk Acoustic Wave Devices: Performance Optimization And Modeling" VTT Publications 756, http://www.vtt.fi/inf/pdf/publications/2011/P756.pdf; dissertation presented Feb. 25, 2011, copyright VTT 2011, 1-108, Feb. 25, 2011.
Ruby et al., "The Effect of Perimeter Geometry on FBAR Resonator Electrical Performance", Microwave Symposium Digest, 2005, IEEE MTT-S International, 217-221, Jun. 12, 2005.
Sanchez et al., "Mixed Analytical and Numerical Design Method for Piezoelectric Transformers", IEEE Xplore, 841-846, 2003.
Strijbos, "Design And Characterisation Of High-Q Solidly-Mounted Bulk Acoustic Wave Filters", ECTC '07 Proceedings, 57th Electronic Components and Technology Conference, Publication Year 2007, 169-174, 2007.
Tang et al., "Micromachined Bulk Acoustic Resonator With A Raised Frame", 16th International Conference on Mechatronics Technology, Tianjin, China, Oct. 16-19, 2012.
Machine Translation of JP2003-505906, published Sep. 30, 2013.
Machine Translation of JP2004/034579, published Apr. 22, 2004.
Machine Translation of WO2004/102688, published Nov. 25, 2004.
Machine Translation of JP2005-159402, published Jun. 16, 2005.

(56) References Cited

OTHER PUBLICATIONS

Machine Translation of WO2006079353, published Aug. 3, 2006.
Machine Translation of JP2006109472, published Apr. 20, 2006.
Machine Translation of JP2006295924, published Oct. 26, 2006.
Machine Translation of JP2006319796, published Nov. 24, 2006.
Machine Translation of JP2007/028669, published Feb. 1, 2007.
Machine Translation of JP2007-006501, published Jan. 11, 2007.
Machine Translation of WO2007085332, published Aug. 2, 2007.
Machine Translation of JP2007-295306, published Nov. 1, 2007.
Machine Translation of JP2008-066792, published Mar. 21, 2008.
Machine Translation of WO2013065488, published May 10, 2013.
Machine Translation of JP2-10907, published Jan. 16, 1990.
Machine Translation of FR2951027, published Apr. 8, 2011.
Machine Translation of JP4471443, published Jun. 2, 2010.
Machine Translation of WO98/38736, published Sep. 3, 1998.
Machine Translation of WO99-37023, published Jul. 22, 1999.
Partial copy of Search Report dated Jan. 9, 2006 for UK Application No. GB0522393.8, 4 pages.
Partial copy of Search Report dated Feb. 2, 2006 for UK Application No. GB0525884.3, 4 pages.
Search Report dated Jul. 11, 2006 for UK Application No. GB0605222.9.
Tiersten et al., "An Analysis of Thickness-Extensional Trapped Energy Resonant Device Structures with Rectangular Electrodes in the Piezoelectric Thin Film on Silicon Configuration", J. Appl. Phys., 54, (10), 5893-5910, Oct. 1983.

* cited by examiner

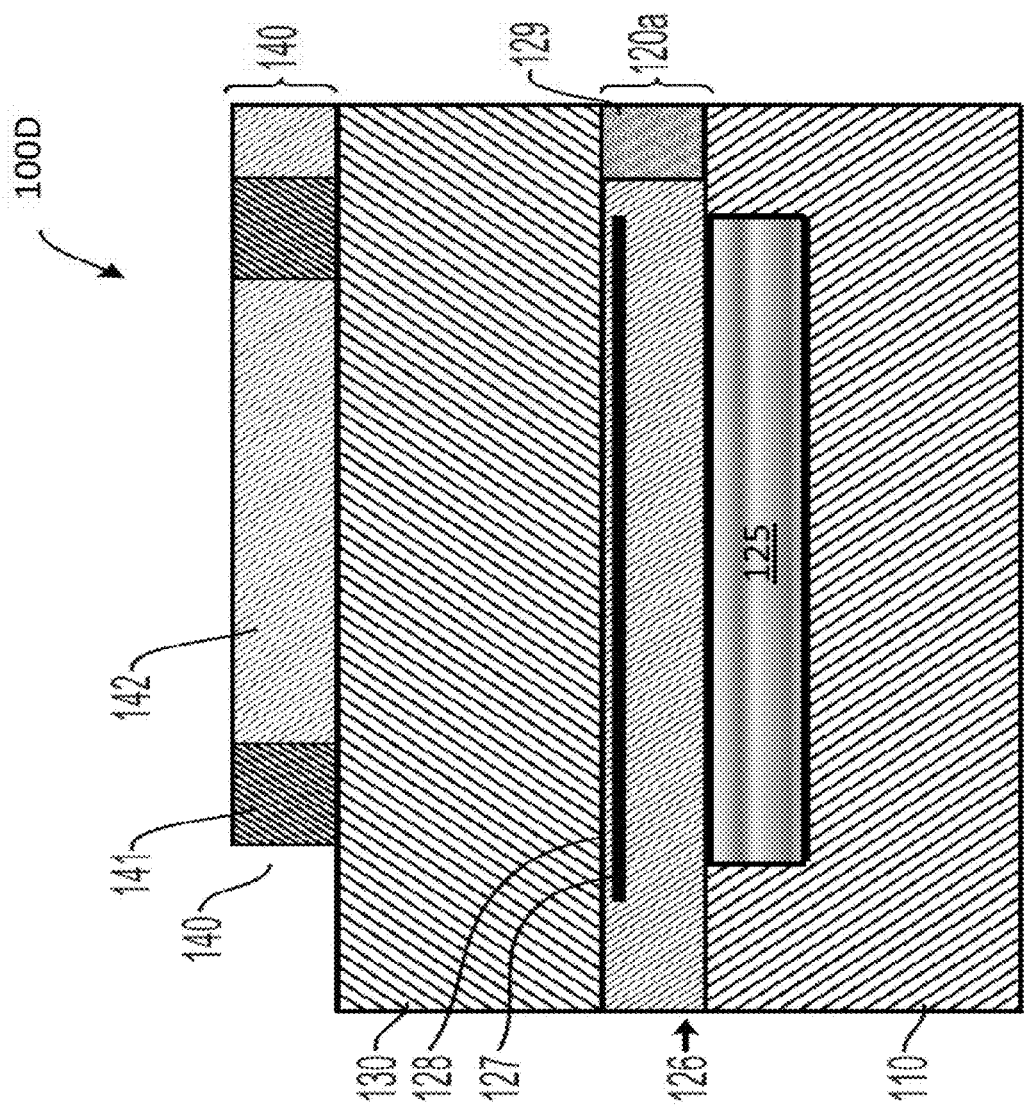

ACCOUSTIC RESONATOR HAVING INTEGRATED LATERAL FEATURE AND TEMPERATURE COMPENSATION FEATURE

CROSS REFERENCE TO RELATED APPLICATION

The present application is a continuation-in-part application under 37 C.F.R. §1.53(b) of commonly owned U.S. patent application Ser. No. 13/660,941, entitled "Acoustic Resonator having Composite Electrodes with Integrated Lateral Features." filed on Oct. 25, 2012, which is hereby specifically incorporated by reference.

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include thin film bulk acoustic resonators (FBARs), which may be used for electrical filters and voltage transformers. Generally, an acoustic resonator has a layer of piezoelectric material between two conductive plates (electrodes), which may form a thin membrane.

FBAR devices, in particular, generate longitudinal acoustic waves and lateral acoustic waves when stimulated by an applied time-varying electric field, as well as higher order harmonic mixing products. The longitudinal acoustic wave, usually called a piston mode, is electrically excited by a vertical electric field between electrode plates and has a form of laterally uniform motion with the boundaries of motion determined by an overlap of top and bottom electrodes and the piezoelectric material. Lateral acoustic waves, usually called lateral modes, are excited at the edges of the piston mode motion and facilitate continuity of appropriate mechanical displacements and stresses between electrically excited and non-excited regions. In general, lateral modes are specific forms of motion supported by a mechanical stack and have both longitudinal and shear components. The lateral modes can either propagate freely (so called propagating modes) or exponentially decay (so called evanescent and complex modes) from the point of excitation. These modes can be excited both by a lateral mechanical discontinuity (for example, at an interface between a frame and a membrane, or at the edge of a top or bottom electrode) or by electric field discontinuity (for example, at an edge of a top electrode where the electric field is terminated abruptly). The lateral modes and the higher order harmonic mixing products generally have a deleterious impact on functionality.

In certain configurations, a frame may be provided along one or more sides of an FBAR to mitigate acoustic losses at the boundaries by minimizing scattering of electrically excited piston mode at the top electrode edges and by improving confinement of mechanical motion to the active region of the FBAR (the region of overlap of the top electrode, the piezoelectric layer, and the bottom electrode). In general, frames are made of added (or removed) thin layers of material along the perimeter of the resonator device with the purpose of lowering (increasing) the cutoff frequency in that region with respect to the main membrane. This in turn minimizes the amplitude of the electrically excited piston mode and the resulting scattering at top electrode edges above (or below) the cut-off frequency of a membrane. Frames also create an acoustic impedance mismatch that enables suppression of the amplitudes of propagating and/or evanescent modes (whichever exist in the frequency range of interest) mechanically excited at the membrane/frame boundary, thus further minimizing acoustic energy leakage to the outside of the active region. However, in addition to improved acoustic energy confinement, as well as further improvements in FBAR quality factor Q due to the better acoustic energy confinement, simplified design and implementation of frames are needed. In particular, in some applications, frames placed above the piezoelectric layer are not effective in suppressing modes confined to the bottom part of the stack.

In addition, FBAR filters in particular need to guarantee sufficiently low insertion loss (IL) across temperature ranges, as well as frequency ranges. Typically, as ambient temperature increases, sound velocity of most materials decreases and the cutoff frequency of each of the FBARS forming the filter decreases. Thus, as the temperature increases, the pass-band of the filter generally moves towards lower frequencies. Therefore, in the absence of temperature compensation, the pass-band must be designed wide enough to allow for changes of the ambient temperature, requiring high a coupling coefficient $kt^2$ of each FBAR, which may be difficult to achieve. Also, in some cases (e.g., Band 13), the pass-band may not be allowed to move to prevent encroachment on other (e.g. safety) bands. Temperature compensation of the filter (and therefore each FBAR) is sometimes required. For example, boron-doped silicon oxide SiOx (which may be referred to as "tempco oxide") may be added as a temperature compensating layer to the FBAR. The sound velocity of tempco oxide increases with temperature, which yields the desired stabilization of resonator and filter response with changes in ambient temperature. The temperature compensating layer may be embedded into either top or bottom electrode, with all the associated process complications. Typical structures to improve Rp and Q are then used: top electrode air-bridges (to eliminate dead-FBAR) and add-on frames on top electrode (to minimize scattering at the top electrode edges.

Typically, the temperature compensating layer lowers the effectiveness of add-on frames used for quality factor Q improvement. The reason is that low acoustic impedance of the temperature compensating layer confines a significant amount of energy both from the piston mode and from stack eigenmodes that are confined to the part of the resonator stack where the temperature compensating layer is placed. The typical add-on frames are placed on the top of the stack in order to facilitate growth of high-quality planar piezoelectric layer. The temperature compensating layer may be placed either below or above the piezoelectric layer, which limits the effectiveness of top add-on frames on suppressing the eigen-modes confined to the bottom of the resonator stack. Thus, approaches allowing for construction of both planarized frames (that may be placed at arbitrary location in the resonator stack) and temperature compensating layers within a BAW resonator stack are needed for applications requiring high-quality factor Q and temperature compensated frequency response.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 1A-1D are cross-sectional diagrams illustrating acoustic resonators having temperature compensating layers and integrated frames, according to representative embodiments.

DETAILED DESCRIPTION

Figure 1A:
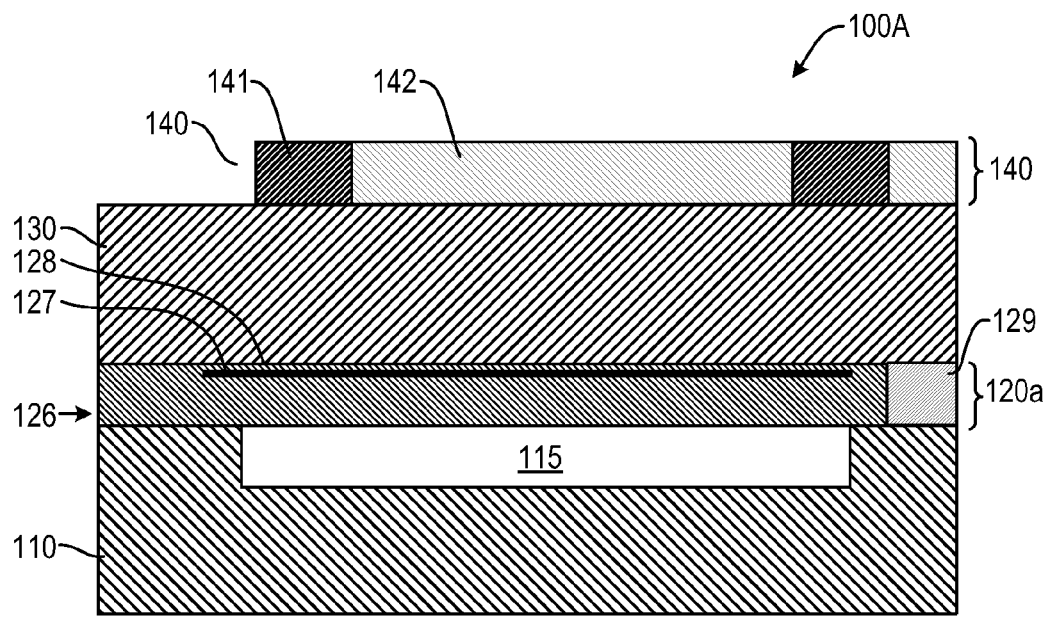

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Further, as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings are directed to including integrated lateral features and/or temperature compensating layers within one or more composite electrodes of a BAW resonator, such as an FBAR. For purposes of discussion, a composite electrode including one or more an integrated lateral features may be referred to as a "frame composite electrode;" a composite electrode including one or more temperature compensating layers may be referred to as a "tempco composite electrode;" and composite electrode including an integrated lateral feature and a temperature compensating layer may be referred to as a "hybrid composite electrode." In various embodiments, one or both of the top and bottom electrodes may be a frame composite electrode, a tempco composite electrode or a hybrid composite electrode in any combination where the resulting BAW resonator includes at least one lateral feature and at least one temperature compensation feature. Similarly, in various embodiments, one of the top and bottom electrodes may be a hybrid composite electrode and the other one of the top and bottom electrodes may be a conventional electrode (i.e., containing no lateral features or temperature compensation features). Further, in various embodiments, the piezoelectric layer of the BAW resonator may include one or more temperature compensating layers, while one or both of the top and bottom electrodes may be a frame composite electrode, a tempco composite electrode or a hybrid composite electrode in any combination where the resulting BAW resonator includes at least one lateral feature in the top and bottom electrodes. Notably, FIGS. 1A to 7 below depict configurations of various embodiments for purposes of illustration, and thus the depicted configurations are not intended to be limiting.

Integrated lateral features may include integrated low velocity and high velocity frames, for example, which generally suppress electrically excited piston mode in the region defined by the feature, and reflect and otherwise resonantly suppress propagating eigenmodes in lateral directions, with both effects simultaneously improving operation of the BAW resonator. Introduction of integrated lateral features generally results in creating at least one of a cut-off frequency mismatch and an acoustic impedance mismatch. The (frame or hybrid) composite electrodes are formed of at least two different conductive materials, such as metals, having different sound velocities and acoustic impedances. The term "integrated" means that the lateral feature is formed within a corresponding composite electrode, as opposed to being formed on or otherwise protruding from one of the surfaces of an electrode, such that the composite electrode maintains substantially planar top and bottom surfaces that are substantially parallel to one another. This simplifies fabrication of the FBAR with regard to application of layers on planar surfaces, yet provides the benefits of the lateral features.

For example, an integrated low velocity frame may be located along the outer edges of an FBAR, which generally increases parallel resistance Rp and quality factor Q above the cut-off frequency. Similarly, an integrated high velocity frame may be located along the outer edges of an FBAR, which generally decreases series resistance Rs and increases quality factor Q below the cut-off frequency. A typical integrated low velocity frame, for example, effectively provides a region with significantly lower cut-off frequency than the main membrane and therefore minimizes the amplitude of the electrically excited piston mode towards the edge of the top electrode in the frame region. Furthermore, it provides two interfaces (impedance miss-match planes), which increase reflection of (mechanically excited at membrane/frame interface) propagating eigenmodes in lateral directions. When the width of the frame is properly designed for a given eigenmode, it results in resonantly enhanced suppression of that particular eigenmode. Lastly, a sufficiently wide integrated low velocity frame provides a region for smooth decay of the evanescent and complex modes mechanically excited at the membrane/frame interface. The combination of these three effects yields better energy confinement and higher quality factor Q at parallel resonance frequency Fp.

In addition, the temperature compensating layer may be deposited between an electrode layer and a conductive interposer layer in a (tempco or hybrid) composite electrode. The temperature compensating layer may be formed of an oxide material, such as boron silicate glass (BSG), for example, having a positive temperature coefficient which offsets at least a portion of negative temperature coefficients of the piezoelectric layer and the conductive material in the top and bottom electrodes. The interposer layer may make a DC electrical connection with the electrode layer, effectively shorting out a capacitive component of the temperature compensating layer and increasing a coupling coefficient $kt^2$ of the FBAR. Also, the interposer layer, which is positioned between the temperature compensating layer the piezoelectric layer, presents a barrier preventing oxygen in the temperature compensating layer from diffusing into the piezoelectric material of the piezoelectric layer. Further description of temperature compensating layers is included in U.S. Pat. App. Pub. No. 2011/0266925 (published Nov. 3, 2011) to Ruby et al., which is hereby incorporated by reference.

Certain aspects of the present teachings build upon components of FBAR devices, FBAR-based filters, their materials and methods of fabrication. Many details of FBARs, materials thereof and their methods of fabrication may be found in one or more of the following U.S. patents and patent applications: U.S. Pat. No. 6,107,721 (Aug. 22, 2000) to Lakin; U.S. Pat. No. 5,587,620 (Dec. 24, 1996), U.S. Pat. No. 5,873,153 (Feb. 23, 1999) U.S. Pat. No. 6,507,983 (Jan. 21, 2003) and U.S. Pat. No. 7,388,454 (Jun. 17, 2008) to Ruby, et al.; U.S. Pat. No. 7,629,865 (Dec. 8, 2009) to Ruby; U.S. Pat. No. 7,714,684 (May 11, 2010) to Ruby et al.; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No. 2010/0327697, entitled "Acoustic Resonator Structure Comprising a Bridge" to Choy et al.; U.S. Pat. App. Pub. No. 2010/0327994, entitled "Acoustic Resonator Structure having an Electrode with a Cantilevered Portion" to Choy et al.; and U.S. Pat. App. Pub. No. 2012/0218056, entitled "Coupled Resonator Filter Comprising a Bridge" to Burak published Aug. 30, 2012. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

Figure 1B:
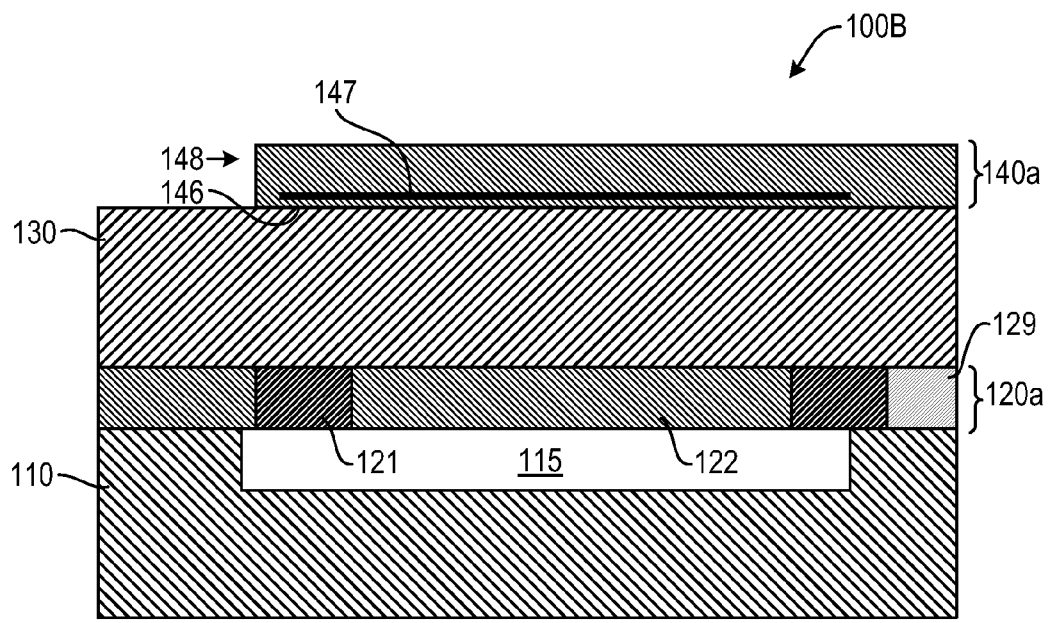
Figure 1C:
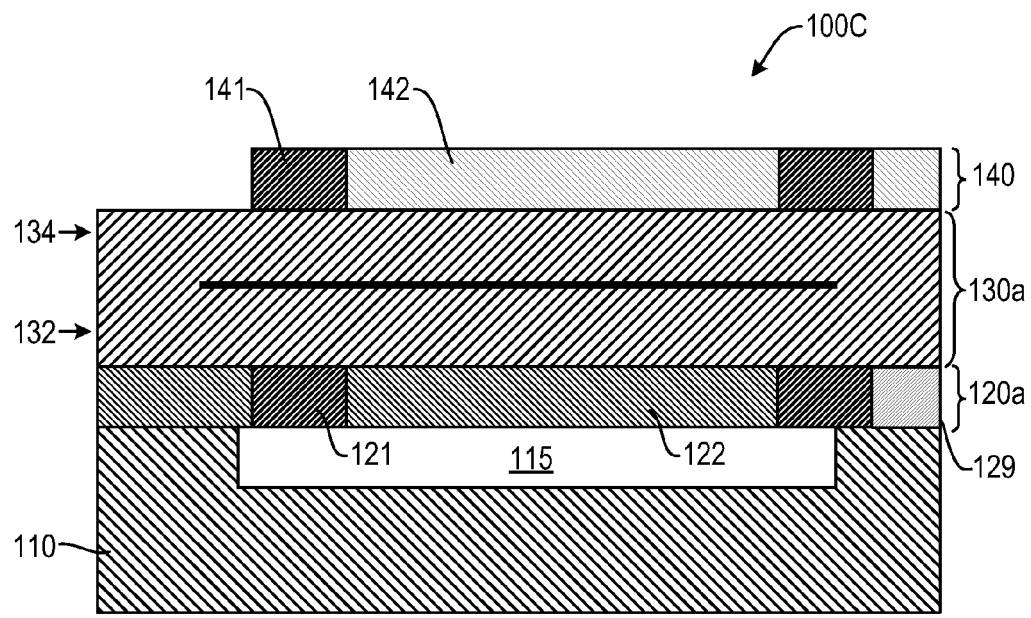

FIGS. 1A-1C are cross-sectional diagrams illustrating acoustic resonators, according to representative embodiments. In the examples depicted in FIGS. 1A-1C (as well as the examples depicted in FIGS. 2-7, discussed below), the acoustic resonator is an FBAR, for convenience of explanation. However, it is understood that other types of acoustic resonators may be included, without departing from the scope of the present teachings. Each of the acoustic resonators shown in FIGS. 1A-1C includes an integrated low velocity frame in at least one frame composite electrode and a temperature compensating layer in a tempco composite electrode or the piezoelectric layer. It is understood that the same general configurations may be included in acoustic resonators having an integrated high velocity frame, in addition to or in place of an integrated low velocity frame, without departing from the scope of the present teachings.

Referring to FIG. 1A, FBAR 100A includes a resonator stack comprising multiple layers stacked over substrate 110 having a cavity 115 for reflection of acoustic waves. In various alternative configurations, a known acoustic mirror, such as a Bragg mirror (e.g., Bragg mirror 125 in FIG. 1D) comprising alternating layers of high and low acoustic impedance materials (not shown) may be provided in the substrate 110 to provide acoustic isolation, in place of the cavity 115, without departing from the scope of the present teachings. The substrate 110 may be formed of a material compatible with semiconductor processes, such as silicon (Si), gallium arsenide (GaAs), indium phosphide (InP), glass, sapphire, alumina, or the like, for example. Various illustrative fabrication techniques of cavities in a substrate are described by U.S. Pat. No. 7,345,410 (Mar. 18, 2008) to Grannen et al., and various illustrative fabrication techniques of acoustic mirrors are described by in U.S. Pat. No. 7,358,831 (Apr. 15, 2008), to Larson III, et al., which are hereby incorporated by reference in their entireties.

The FBAR 100A further includes piezoelectric layer 130 sandwiched between two composite electrodes: a first or bottom electrode 120a, which is a tempco composite electrode containing temperature compensating layer 127, and second or top electrode 140, which is a frame composite electrode containing integrated low velocity frame 141. The bottom electrode 120a is disposed over the substrate 110 and the cavity 115. A planarization layer 129 is also provided over the substrate 110 as shown in order to provide a planar top surface of the bottom electrode 120a. In a representative embodiment, the planarization layer 129 includes non-etchable borosilicate glass (NEBSG), for example. In general, the planarization layer 129 does not need to be present in the structure (as it increases overall processing cost), but when present, it may improve quality of growth of subsequent layers and simplify their processing. The piezoelectric layer 130 is disposed over the bottom electrode 120a, and the top electrode 140 is disposed over the piezoelectric layer 130. Together, the bottom electrode 120a, the piezoelectric layer 130 and the top electrode 140 form the (thin) membrane of the FBAR 100A. The piezoelectric layer 130 is formed of a thin film of piezoelectric material, such as aluminum nitride (AlN), zinc oxide (ZnO) or lead zirconium titanate (PZT), for example. However, other materials may be incorporated without departing from the scope of the present teachings.

The FBAR 100A includes integrated temperature compensating layer 127 in the bottom electrode 120a, which stabilizes changes of the sound velocity and the cut-off frequency of the piezoelectric layer 130 in response to changes in temperature. More particularly, the bottom electrode 120a includes outside electrode layer 126, temperature compensating layer 127 and conductive interposer layer 128 (hereafter interposer layer 128) stacked in this order on the substrate 110. The interposer layer 128 separates the temperature compensating layer 127 from the piezoelectric layer 130, so that the temperature compensating layer 127 is effectively buried within the bottom electrode 120a. In other words, the temperature compensating layer 127 is not formed on a top or bottom surface of the bottom electrode 120a and is therefore separated from adjacent components (e.g., piezoelectric layer 130 and substrate 110) in the resonator stack. Although the presence of the interposer layer 128 is not necessary, it facilitates proper growth of the piezoelectric layer 130 and otherwise provides protection of the temperature compensating layer 127 (e.g., from hydrofluoric acid (HF) used for wet etching or wet release process) during the fabrication process. Also, the presence and thickness of the interposer layer 128 affect temperature compensation effects of the temperature compensating layer 127. In addition, thick enough interposer layer 128 made of low sheet resistance metal, for example, may electrically short the temperature compensating layer 127, therefore eliminating its series capacitance and increasing electromechanical coupling coefficient $Kt^2$.

The temperature compensating layer 127 is shown encapsulated within the bottom electrode 120, meaning that it is surrounded by the outside electrode layer 126 and the interposer layer 128. An example of encapsulating the temperature compensating layer 127 is described below in more detail with reference to FIG. 2. However, in alternative embodiments, the temperature compensating layer 127 may not be encapsulated, or may be partially encapsulated, such that at least a portion of the temperature compensating layer 127 is exposed at one or more edges (top, bottom or side) of the bottom electrode 120a. For example, the temperature compensating layer 127 may extend the entire width (horizontal direction in the depicted orientation) of the bottom electrode 120a.

In the bottom electrode 120a, the outside electrode layer 126 and the interposer layer 128 may be formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In the depicted embodiment, the outside electrode layer 126 and the interposer layer 128 are formed of the same conductive material (e.g., Mo). However, in various alternative embodiments, the outside electrode layer 126 and the interposer layer 128 may be formed of different conductive materials, where the outside electrode layer 126 is formed of a material having relatively lower conductivity and relatively higher acoustic impedance, and the interposer layer 128 is formed of a material having relatively higher conductivity and relatively lower acoustic impedance. For example, the outside electrode layer 126 may be formed of W and the interposer layer 128 may be formed of Mo, although other materials and/or combinations of materials may be used without departing from the scope of the present teachings.

The temperature compensating layer 127 may be formed of various materials compatible with semiconductor processes, including boron silicate glass (BSG), silicon dioxide ($SiO_2$), chromium (Cr) or tellurium oxide (TeO(x)), for example, which have positive temperature coefficients. The positive temperature coefficient of the temperature compensating layer 127 offsets negative temperature coefficients of other materials in the resonator stack, including the piezoelectric layer 130, the second electrode 140, and the outside electrode and interposer layers 126 and 128 of the bottom electrode 120a.

The FBAR 100A further includes integrated low velocity frame 141 surrounding inner portion 142 in the top electrode 140, which minimizes scattering of piston mode at the top electrode 140 edge at frequencies above the cut-off frequency of the membrane by three mechanisms: (1) minimization of piston mode amplitude excited by time-harmonic electric field in the integrated lateral feature region, (2) suppression at least a portion of the thickness extensional (TE), thickness shear (TS) and flexural propagating lateral acoustic modes, and (3) facilitation of exponential decay of evanescent and higher-order complex TE modes. According to the depicted representative embodiment, the integrated low velocity frame 141 is formed of a first material and the inner portion 142 is formed of a second material different from the first material, where the first material has lower sound velocity than the second material. For example, the integrated low velocity frame 141 may be formed of W and the inner portion 142 may be formed of Mo, although other materials may be incorporated without departing from the scope of the present teachings. More generally, in various embodiments, the first material may have a sound velocity, acoustic impedance and location in the resonator stack, in relation to the sound velocity, acoustic impedance and location in the resonator stack of second material, that are designed to lower the effective sound velocity of the portion of the resonator stack comprising the first material. For example, a frame composite electrode may include one or more alternative metal materials, such as Al or copper (Cu), or dielectric materials, such as $SiO_2$, silicon nitride (SiN), silicon carbide (SiC), AlN, ZnO or PZT, in place of a metal material. It should be apparent to one skilled in the art that in a resonator device, like an FBAR, high or low sound velocity in a specific peripheral region of the resonator device (e.g., integrated high or low velocity frame regions) means that the cutoff frequency in that region is higher or lower, respectively, as compared to the cutoff frequency of a central region of the resonator device.

In the depicted embodiment, the integrated low velocity frame 141 is co-planar with the inner portion 142, meaning that both the integrated low velocity frame 141 and the inner portion 142 have substantially the same thickness (in the vertical direction according to the orientation shown in FIG. 1A) within the top electrode 140. Stated differently, the integrated low velocity frame 141 forms a ring of equal thickness around the inner portion 142. The integrated low velocity frame 141 is generally located in an outer region of the FBAR 100A, and may be formed around all or part of a parameter of the top electrode 140. For example, the FBAR 100A (as well as the other FBARs discussed herein) may be apodized or irregular in shape from a top perspective (not shown), and the integrated low velocity frame 141 may substantially follow along an outer perimeter of the top electrode 140. That is, the top electrode 140 may have five sides arranged in a substantially trapezoidal shape, for example, in which case the integrated low velocity frame 141 may be formed along all five sides, or fewer than all five sides of the FBAR 100A.

The top electrode 140 may further include a passivation layer (not shown), which may be formed of various types of materials, including AlN, SiC, BSG, SiO2, SiN, polysilicon, and the like. The thickness of the passivation layer is sufficient to insulate all layers of the resonator stack from the environment, including protection from moisture, corrosives, contaminants, debris and the like. The first and second electrodes 120a and 140 are electrically connected to external circuitry via contact pads (not shown), which may be formed of a conductive material, such as gold, gold-tin alloy or the like.

The bottom electrode 120a may be formed by applying a layer of conductive material (e.g., W) to a top surface of the substrate 110 and the cavity 115 (before releasing sacrificial material initially filling the cavity 115) using a sputtering, evaporation or chemical vapor disposition (CVD) technique, for example, to the desired thickness to form the outside electrode layer 126. Then, a layer of temperature compensation material (e.g., $SiO_2$) is applied to the outside electrode layer 126 to form the temperature compensating layer 127, and another layer of conductive material (e.g., Mo) is applied to the temperature compensation layer 127 to form the interposer layer 128 using a sputtering, evaporation or CVD technique, for example. An example of forming an encapsulated temperature compensating layer is discussed below with reference to FIG. 2. Various illustrative techniques for forming temperature compensating layers are described, for example, in U.S. Pat. No. 7,561,009 to Larson, III, et al., which is hereby incorporated by reference. The piezoelectric layer 130 is grown on the interposer layer 128 using known techniques, such as RF and DC magnetron sputtering, spin-on, evaporation, CVD, laser assisted deposition and the like.

The top electrode 140 may be formed by applying a layer of the first material (e.g., W) to a top surface of the piezoelectric layer 130 using a sputtering, evaporation or CVD technique, for example, to the desired thickness. Then dry etch is used to define a desired pattern of the first material forming the low velocity frame 141. A thin metal-etch stop layer (300 Å of AlN, for example) (not shown) is deposited over the piezoelectric layer 130 and the integrated low velocity frame 141. The second material (e.g., Mo) is deposited over a top surface of the piezoelectric layer 130 and the low velocity frame 141 (and over the metal-etch stop layer) using a sputtering, evaporation or CVD technique, for example, to the desired thickness. The second material is then etched from the piezoelectric layer 130 and from the low velocity frame 141, following application of a photoresist pattern (e.g., via photolithography), using sulfur hexafluoride ($SF_6$)-based plasma etch, for example, forming the desired pattern of the top electrode 140. Finally, chemical-mechanical planarization (CMP) using aluminum oxide abrasive, for example, is performed to obtain a desired substantially planar top electrode 140. Of course, various other techniques may be incorporated to form the bottom and top electrodes 120a and 140, as would be apparent to one of ordinary skill in the art.

Referring to FIG. 1B, the FBAR 100B is similar to the FBAR 100A, except that the bottom electrode 120 is a frame composite electrode including integrated lateral features and the top electrode 140a is a tempco composite electrode including integrated temperature compensation features. The integrated lateral features of the bottom electrode 120 include integrated low velocity frame 121 surrounding inner portion 122. The integrated low velocity frame 121 is formed of the first material (e.g., W) and the inner portion 122 is formed of the second material (e.g., Mo) different from the first material, where the first material has lower sound velocity than the second material.

In the depicted embodiment, the integrated low velocity frame 121 is co-planar with the inner portion 122, meaning that both the integrated low velocity frame 121 and the inner portion 122 have substantially the same thickness (in the vertical direction according to the orientation shown in FIG. 1B) within the bottom electrode 120. Stated differently, the integrated low velocity frame 121 forms a ring of equal thickness around the inner portion 122. The integrated low velocity frame 121 is generally located in an outer region of the FBAR 100B, and may be formed around all or part of a parameter of the bottom electrode 120.

The bottom electrode 120 may be formed on the top surface of the substrate 110 and the cavity 115 (before releasing sacrificial material initially filling the cavity 115) in substantially the same manner as the top electrode 140 is formed on the top surface of the piezoelectric layer, discussed above. The piezoelectric layer 130 is grown on the top surface of the bottom electrode 120. In an embodiment, a seed layer may first be applied to the bottom electrode 120 to assist in growing the piezoelectric layer 130.

The integrated tempco features of the top electrode 140a include integrated temperature compensating layer 147 in the top electrode 140a. More particularly, the top electrode 140a includes interposer layer 146, temperature compensating layer 147 and outside electrode layer 148 stacked in this order on the piezoelectric layer 130. The interposer layer 146 separates the temperature compensating layer 147 from the piezoelectric layer 130. Although the presence of an interposer layer is not necessary, particularly since it is not required to assist growth of the piezoelectric layer 130, it provides protection of the temperature compensating layer 147 (e.g., from HF used for wet etching) during the fabrication process, and otherwise influences the temperature compensation effects of the temperature compensating layer 147. In alternative embodiments, the interposer layer 146 is not included, and thus the temperature compensating layer 147 is formed directly on the top surface of the piezoelectric layer 130. Also, although the temperature compensating layer 147 is shown encapsulated within the top electrode 140a, it is understood that it may extend the entire width of the top electrode 140a, or otherwise be only partially encapsulated within the top electrode 140a, without departing from the scope of the present teachings.

In the top electrode 140a, the interposer and outside electrode layers 146 and 148 may be formed of the same or different electrically conductive materials, as discussed above with regard to outside electrode and interposer layers 126 and 128. In an embodiment, the outside electrode layer 148 may be formed of a material having relatively lower conductivity and relatively higher acoustic impedance, and the interposer layer 146 may be formed of a material having relatively higher conductivity and relatively lower acoustic impedance. For example, the outside electrode layer 146 may be formed of W and the interposer layer 146 may be formed of Mo, although other materials and/or combinations of materials may be used without departing from the scope of the present teachings. The temperature compensating layer 147 may be formed of various materials compatible with semiconductor processes, including BSG, $SiO_2$, Cr or $TeO_{(x)}$, for example, which have positive temperature coefficients.

The top electrode 140a may be formed by applying a layer of conductive material to a top surface of the piezoelectric layer 130 using a sputtering, evaporation or CVD technique, for example, to the desired thickness to form the interposer layer 146. Then, a layer of temperature compensation material (e.g., $SiO_2$) is applied to the interposer layer 146 to form the temperature compensating layer 147, and another layer of conductive material is applied to the temperature compensation layer 147 and exposed portions of the interposer layer 128 to form the outside electrode layer 148, respectively using a sputtering, evaporation or CVD technique, for example. Of course, various other techniques may be incorporated to form the bottom and top electrodes 120 and 140a, as would be apparent to one of ordinary skill in the art.

Referring to FIG. 1C, the FBAR 100C is similar to the FBARs 100A and 100B, except that both the bottom electrode 120 and the top electrode 140 are frame composite electrodes including integrated lateral features, and piezoelectric layer 130a includes integrated temperature compensation features. The integrated lateral features of the top electrode 140 include integrated low velocity frame 141 surrounding inner portion 142, and the integrated lateral features of the bottom electrode 120 include integrated low velocity frame 121 surrounding inner portion 122. The construction of these integrated lateral features is the same as discussed above with regard to FBARs 100A and 100B, respectively, so the description will not be repeated. Having integrated lateral feature in both the top and bottom electrodes 120 and 140 further minimizes scattering of piston mode at frequencies above the cut-off frequency of the membrane.

The piezoelectric layer 130a includes temperature compensating layer 137, which may be buried in the piezoelectric layer 130a. In other words, the temperature compensating layer 327 is not formed on a top or bottom surface of the piezoelectric layer 130 and is therefore separated from adjacent components (e.g., bottom and top electrodes 120 and 140) in the resonator stack. In the depicted embodiment, the temperature compensating layer 137 is positioned approximately half way through the total thickness of the piezoelectric layer 130a, for example. The piezoelectric layer 130a may be formed of two layers of the same material, indicated as bottom piezoelectric layer 132 and top piezoelectric layer 134, with the temperature compensating layer 137 formed in between. The temperature compensating layer 137 may be formed of various materials compatible with semiconductor processes, including BSG, $SiO_2$, Cr or $TeO_{(x)}$, for example, which have positive temperature coefficients. The positive temperature coefficient of the temperature compensating layer 137 offsets negative temperature coefficients of other materials in the resonator stack, including the piezoelectric layer 130, and the bottom and top second electrodes 120 and 140. Also, although the temperature compensating layer 137 is shown encapsulated within the piezoelectric layer 130a, it is understood that it may extend the entire width of the piezoelectric layer 130a, or otherwise be only partially encapsulated within the piezoelectric layer 130a, without departing from the scope of the present teachings.

The piezoelectric layer 130a may be formed by growing the bottom piezoelectric layer 132 of piezoelectric material (e.g., AlN) on a top surface of the bottom electrode 120, then applying a layer of temperature compensation material (e.g., $SiO_2$) to the bottom piezoelectric layer 132 to form the temperature compensating layer 137 using a sputtering, evaporation or CVD technique, for example. An example of forming an encapsulated temperature compensating layer is discussed below with reference to FIG. 2. A piezoelectric material (e.g., AlN) is grown on a top surface of the bottom piezoelectric layer 132 and the temperature compensating layer 137 to form the top piezoelectric layer 134. Of course, different materials may be incorporated without departing from the scope of the present teachings.

Referring generally to FIGS. 1A-1D, the integrated low velocity frames 121 and 141 present a substantial down-shift of cut-off frequency yielding substantially lower amplitude of electrically excited piston mode at the pass-band frequencies (above the series resonance frequency). Also, the integrated low velocity frames 121 and 141 provide large acoustic impedance discontinuities to both propagating and evanescent modes mechanically excited at interfaces between integrated low velocity frames 121 and 141 and the inner portions 122 and 142, respectively. Beneficially, impact of this discontinuity on the acoustic waves can be minimized by proper selection of integrated low velocity frame width, thus suppressing the propagating eigen-modes and exponentially decaying the evanescent and complex eigen-modes. As a result, total acoustic energy density at the edge of the top electrode 140 is minimized, which beneficially yields minimized scattering of acoustic energy and increased parallel resistance Rp and quality factor Q of the FBARs 100A-100C.

Further, representative FBARs 100A-100C (as well as the other FBARs discussed herein) may be apodized or irregular in shape, as discussed above, and the integrated low velocity frames 121 and 141 may be formed around all or part of a parameter of the bottom and top electrodes 120 and 140. In general, an active region of each of the FBARs 100A-100C, in particular, is defined by overlap between the top electrode 140, the piezoelectric layer 130 and the bottom electrode 120. However, since both the low velocity frames 121 and 141 facilitate significant down shift of cut-off frequency, an effective active region of the FBAR 100C, in particular, in the pass-band frequency range is determined by overlap of the bottom and top inner portions 122 and 142, and the piezoelectric layer 130. Of course, the FBARs 100A-100C may be formed in various alternative shapes, such as circular, square, rectangular, trapezoidal, etc., without departing from the scope of the present teachings. Also, in various embodiments, the integrated low velocity frames 121 and 141 may be shaped differently from the shape of the FBARs 100A-100 and/or the integrated low velocity frames 121 and 141 may not be disposed along all of the edges of the bottom and top electrodes 120 and 140, respectively.

The outer region of each of the FBARs 100A-100C (as well as the other FBARs discussed herein) generally includes portions at and/or near an outer perimeter of bottom and top electrodes 120 and 140. The outer region may extend toward (but not include) a central region by various amounts, depending on application specific design requirements of various implementations, for example. The central region generally includes a portion of each of the bottom and top electrodes 120 and 140 that incorporates the center of the active region of the FBAR 100A-100C. In FIGS. 1A-1C, the inner portions 122 and/or 142 of the bottom and top electrodes 120 and 140 incorporate the central region.

Illustratively, each of the bottom electrode 120 and the top electrode 140 may be formed of W and Mo, as mentioned above, and have a thickness (vertical direction in the depicted orientation) of approximately 1000 Å to approximately 20000 Å. In various embodiments, the bottom and top electrodes 120 and 140 may have the same or different thicknesses from one another. Because the integrated low velocity frames 121 and 141 are the same thicknesses as the bottom and top electrodes 120 and 140, respectively, these thicknesses may be varied only by varying the total thicknesses of the bottom and top electrodes 120 and 140. Each of the integrated low velocity frames 121 and 141 may have a width (horizontal direction in the depicted orientation) of approximately 0.1 µm to approximately 10 µm, for example. In various embodiments, the integrated low velocity frames 121 and 141 may have the same or different widths from one another. The piezoelectric layer 130 may be formed of AlN and have a thickness of approximately 5000 Å to approximately 25000 Å, for example.

The respective dimensions of the bottom and top electrodes 120 and 140, and the integrated low velocity frames 121 and 141 (as well as the dimensions of the piezoelectric layer 130), may be varied to provide unique benefits for any particular situation or to meet application specific design requirements of various implementations. Accordingly, when designed properly for maximum piston mode and eigenmode suppression at the edges of bottom and top electrodes 120 and 140, the integrated low velocity frames 121 and 141 improve the energy confinement inside the FBARs 100A-100C, which manifests itself by increased parallel resistance Rp and quality factor Q.

As should be appreciated by one of ordinary skill in the art, the structure provided by the bottom electrode 120, the piezoelectric layer 130 and the top electrode 140 is a BAW resonator. When the BAW resonator is disposed over a cavity (e.g., the cavity 115), it is a so-called FBAR, and when the BAW resonator is disposed over an acoustic mirror (e.g., Bragg mirror), it is a so-called solidly mounted resonator (SMR). The teachings herein apply to both FBARs and SMRs, which may be used in a variety of applications, including filters (e.g., ladder filters comprising a plurality of BAW resonators). However, the effects related to minimization of piston mode scattering at the edge of the top electrode 140 with the integrated low velocity frames 121 and/or 141 on parallel resistance Rp and on series resistance Rs of the FBARs 100A-100C (as well as the other FBARs discussed herein) are generally the same as the effects on parallel resistance Rp and series resistance Rs of an SMR supporting a similar set of modes, as would be appreciated by one of ordinary skill in the art.

Referring to FIG. 1D, an SMR 100D is depicted. The SMR 100D is substantively the same, for example, as the FBAR 100A, except for the inclusion of Bragg mirror 125 (or similar acoustic reflector) in place of cavity 115.

Figure 2:
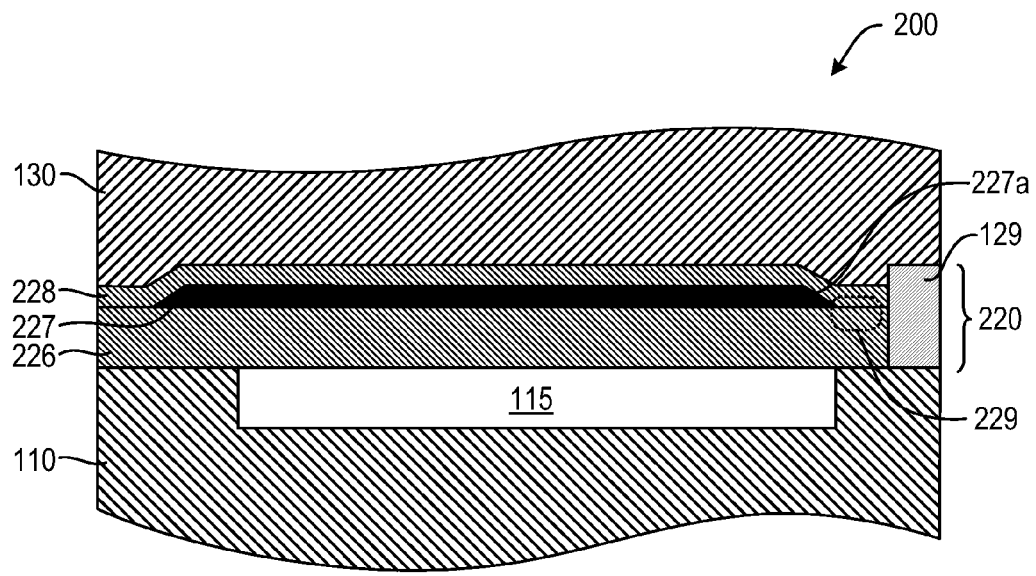
FIG. 2 is a cross-sectional diagram illustrating an acoustic resonator having an encapsulated temperature compensating layer, according to representative embodiments.

FIG. 2 is a cross-sectional diagram illustrating an acoustic resonator, including an encapsulated temperature compositing layer, according to a representative embodiment.

Referring to FIG. 2, FBAR 200 includes a resonator stack comprising multiple layers stacked over substrate 110 having a cavity 115 for reflection of acoustic waves. The FBAR 200 further includes piezoelectric layer 130 sandwiched between first or bottom electrode 220 and second or top electrode (not shown in FIG. 2), which may be a frame composite electrode containing an integrated low velocity frame (e.g., such as integrated low velocity frame 141). In the depicted configuration, the bottom electrode 220 includes outside electrode layer 226, encapsulated temperature compensating layer 227 and interposer layer 228 stacked in this order on the substrate 110. The substrate 110, the cavity 115, the piezoelectric layer 130 and the planarization layer 129 are substantially the same as discussed above with reference to FIGS. 1A-1C, and therefore the descriptions will not be repeated.

In the depicted embodiment, the outside electrode layer 226 and the interposer layer 228 are formed of the same electrically conductive materials, such as various metals compatible with semiconductor processes, including W, Mo, Al, Pt, Ru, Nb, or Hf, for example. In alternative embodiments, the outside electrode layer 226 and the interposer layer 228 may be formed of different conductive materials, where the outside electrode layer 226 is formed of a material having relatively lower conductivity and relatively higher acoustic impedance, and the interposer layer 228 is formed of a material having relatively higher conductivity and relatively lower acoustic impedance. For example, the outside electrode layer 226 may be formed of W and the interposer layer 228 may be formed of Mo, although other materials and/or combinations of materials may be used without departing from the scope of the present teachings.

The temperature compensating layer 227 is formed between the outside electrode and interposer layers 226 and 228, and is therefore separated or isolated from the piezoelectric layer 130 by the interposer layer 228 and is otherwise sealed in by the connection between the outside electrode and interposer layers 226 and 228. Accordingly, the temperature compensating layer 227 is effectively encapsulated within the bottom electrode 220. The temperature compensating layer 227 may be formed of various materials having positive temperature coefficients, as discussed above with regard to temperature compensating layer 127, for example.

The interposer layer 228, which is formed on the top and side surfaces of the temperature compensating layer 227, contacts the top surface of the outside electrode layer 226, as indicated for example by reference number 229. Therefore, a DC electrical connection is formed between the outside electrode layer 226 and the interposer layer 228. By DC electrically connecting the outside electrode layer 226 and the interposer layer 228, the interposer layer 228 effectively "shorts" out a capacitive component of the temperature compensating layer 227, thus increasing a coupling coefficient $kt^2$ of the FBAR 2X00. In addition, the interposer layer 228 provides a barrier that prevents oxygen in the temperature compensating layer 227 from diffusing into the piezoelectric layer 130, preventing contamination of the piezoelectric layer 130. Also, in the depicted embodiment, the temperature compensating layer 227 has tapered edges 227a, which enhance the DC electrical connection between the interposer layer 228 and the outside electrode layer 226. In addition, the tapered edges 227a enhance the mechanical connection between the interposer layer 228 and the outside electrode layer 226, which improves the sealing quality, e.g., for preventing oxygen in the temperature compensating layer 227 from diffusing into the piezoelectric layer 130. In alternative embodiments, one or both of the edges of the temperature compensating layer 227 are not tapered, but may be substantially perpendicular to the top and bottom surfaces of the temperature compensating layer 227, for example, without departing from the scope of the present teachings.

Of course, the relative thicknesses of the outside electrode and interposer layers 226 and 228 and/or the temperature compensating layer 227 may be varied, without departing from the scope of the present teachings. For example, the thickness of the interposer layer 228 may be increased, thus "sinking" the temperature compensating layer 227 deeper into the composite bottom electrode 220 (and further away from the active piezoelectric layer 130). Generally, the thickness and location of the temperature compensating layer 227, as well as the thicknesses of the outside electrode layer 226 and the interposer layer 228, within the bottom electrode 220 should be optimized in order to maximize the coupling coefficient for an allowable linear temperature coefficient. This optimization may be accomplished, for example, by modeling an equivalent circuit of the resonator stack using a Mason model, as would be apparent to one of ordinary skill in the art. Although there is some degradation in the offsetting effects of the temperature coefficient by sinking the temperature compensating layer 227, the coupling coefficient of the FBAR 200 may be improved. An algorithm may be developed to optimize the depth of the temperature compensating layer 227 in the bottom electrode 220 in light of the trade-off between the temperature coefficient and the coupling coefficient, for example, using a multivariate optimization technique, such as a Simplex method, as would be apparent to one of ordinary skill in the art. In addition, the depth of the temperature compensating layer 227 may be limited by various constraints, such as minimum necessary coupling coefficient and maximum allowable temperature coefficient. Likewise, the thickness of the temperature compensating layer 227 may be adjusted to provide the optimal coupling coefficient and a minimum overall temperature coefficient of the FBAR 200. Such optimization and corresponding considerations regarding temperature compensating layers are also applicable to the other FBARs discussed herein.

The bottom electrode 220 may be formed by applying a layer of conductive material (e.g., Mo) to a top surface of the substrate 110 and the cavity 115 (before releasing sacrificial material initially filling the cavity 115) using a sputtering, evaporation or CVD technique, for example, to the desired thickness to form the outside electrode layer 226. Then, a layer of temperature compensation material (e.g., $SiO_2$) is formed on a top surface of the outside electrode layer 226. In an embodiment, the temperature compensating layer 227 is formed of BSG, for example, although different materials may be used, as discussed above with reference to the temperature compensating layers of FIGS. 1A-1C, without departing from the scope of the present teachings. The temperature compensation material may be applied using sputtering, evaporation or CVD techniques, for example, although other application methods may be incorporated.

The temperature compensation material is etched to a desired size to form the temperature compensating layer 227 and the edges are tapered to form the tapered edges 227A. For example, a photoresist layer (not shown) may be applied to the top surface of the temperature compensating layer 227 and patterned to form a mask or photoresist pattern, using any phostoresist patterning technique compatible with semiconductor processes, as would be apparent to one of ordinary skill in the art. The photoresist pattern may be formed by machining or by chemically etching the photoresist layer using photolithography, although various alternative techniques may be incorporated. Following etching of the temperature compensating layer 227, the photoresist pattern is removed, for example, by chemically releasing or etching using a wet etch process including HF etch solution, although the photoresist pattern may be removed by various other techniques, without departing from the scope of the present teachings.

In various embodiments, to obtain the tapered edges 227a, oxygen may be leaked into the etcher used to etch the temperature compensating layer 227. The oxide (and/or temperature chuck) causes the photoresist to erode more quickly at the edges of the patterned photo resist and to pull back slightly. This "thinning" of the resist forms a wedge shape profile that is then imprinted into the oxide underneath as the photoresist goes away. Generally, the wedge is created by adjusting the etch rate of resist relative to the etched material, as would be apparent to one of ordinary skill in the art. Meanwhile, further from the edges of the temperature compensating layer 227, there is sufficient photoresist coverage throughout the etch that the underlying oxide material is not touched. Of course, other methods of obtaining tapered edges 227a may be incorporated without departing from the scope of the present teachings.

The interposer layer 228 is applied to top surfaces of the temperature compensating layer 227 and the outside electrode layer 226. The interposer layer 228 is formed of Mo, for example, although different materials may be used, as discussed above, without departing from the scope of the present teachings. The interposer layer 228 may be applied using sputtering, evaporation or CVD techniques, for example, although other application methods may be incorporated. The piezoelectric layer 130 is applied to a top surface of the interposer layer 228, which is also the top surface of the bottom electrode 220.

In an alternative embodiment, an interim seed layer (not shown) may be formed on the top surface of the temperature compensation material before etching. The interim seed layer may be formed of the same piezoelectric material as the piezoelectric layer 130, such as AlN, for example. The interim seed layer may be formed to a thickness of about 300 Å, for example, and reduces or minimizes oxide diffusion from the temperature compensating layer 227 into the piezoelectric layer 130. Outer portions of the interim seed layer are removed by etching, along with the etched portions of the temperature compensating layer 227, to expose portions of the top surface of the outside electrode layer 226, so that the outside electrode layer 226 is able to make an electrical connection with the interposer layer 228. In other words, after etching, the interim seed layer covers only the top surface of the temperature compensating layer 227, so that it is positioned between the temperature compensating layer 227 and the interposer layer 228.

As mentioned above, FBAR 200 is depicted as a variation of FBAR 100A. However, it is understood that an encapsulated temperature compensating layer, such as illustrative temperature compensating layer 227, may be included as the temperature compensating layer in any top and/or bottom tempco or hybrid composite electrode discussed herein.

In various embodiments, a BAW resonator, such as an FBAR, for example, includes one or more frame composite electrodes having multiple electrode layers formed of different materials. For example, FIGS. 3A to 7 are cross-sectional diagrams illustrating acoustic resonators, including at least one frame composite electrode or hybrid composite electrode having a multilayer portion comprising at least two electrode layers of different conductive materials stacked in the vertical direction (in the illustrative orientations depicted in FIGS. 3A to 7). For purposes of discussion, the electrode layer closer to the piezoelectric layer may be referred to as an inside electrode layer, and the electrode layer adjacent the inside electrode layer may be referred to as an outside electrode layer, where at least a portion of the outside electrode layer is separated from the piezoelectric layer by at least the inside electrode layer (and possibly an interposer layer and/or a temperature compensation layer, as discussed below). The integrated frames may be implemented by the conductive material having the higher sound velocity than the corresponding inner portion (integrated high velocity frame) or lower sound velocity than the corresponding inner portion (integrated low velocity frame).

FIGS. 3A-3D are cross-sectional diagrams illustrating acoustic resonators, according to representative embodiments. Each of the acoustic resonators shown in FIGS. 3A-3D includes integrated low velocity frames in both electrodes and a temperature compensating layer in at least one of the electrodes. In alternative embodiments, a temperature compensating layer may be included in the piezoelectric layer (e.g., as shown by piezoelectric layer 130a) in addition to or instead of the top and/or bottom electrodes. It is understood that the same general configurations may be included in acoustic resonators having an integrated high velocity frame, in addition to or in place of an integrated low velocity frame, in at least one of the electrodes, respectively, without departing from the scope of the present teachings.

Figure 3A:
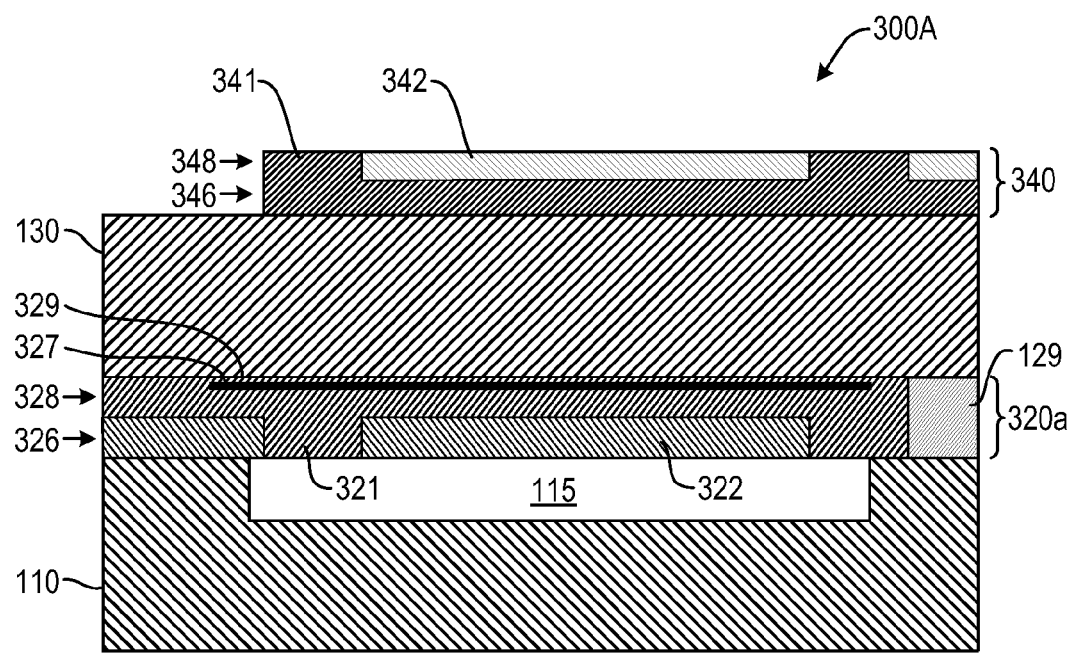
FIGS. 3A-3D are cross-sectional diagrams illustrating acoustic resonators having temperature compensating layers and integrated frames, according to representative embodiments.

Referring to FIG. 3A, FBAR 300A includes a resonator stack comprising a first or bottom electrode 320a, a piezoelectric layer 130, and a second or top electrode 340 stacked over substrate 110 having a cavity 115 for reflection of acoustic waves. In various alternative configurations, the FBAR 300A may include a known acoustic mirror, such as a Bragg mirror (not shown), in place of the cavity 115, as mentioned above. In the depicted embodiment, the bottom electrode 320a is a hybrid composite electrode that includes both integrated lateral features and temperature compensation features, while the top electrode 340 is a frame composite electrode that includes only integrated lateral features.

More particularly, FBAR 300A includes integrated low velocity frame 321 surrounding inner portion 322 in the bottom electrode 320a, and integrated low velocity frame 341 surrounding inner portion 342 in top electrode 340. The integrated low velocity frames 321 and 341 are formed of the first material and the inner portions 322 and 342 are formed of the second material, where the second material has higher sound velocity than the first material, as discussed above. For example, the integrated low velocity frames 321 and 341 may be formed of W and the inner portions 322 and 342 may be formed of Mo, although other materials may be incorporated without departing from the scope of the present teachings.

In the depicted embodiment, the hybrid composite bottom electrode 320a has multiple electrode layers, including outside electrode layer 326, inside electrode layer 328, temperature compensating layer 327 and interposer layer 329 stacked in this order on the substrate 110. The interposer layer 329 separates the temperature compensating layer 327 from the piezoelectric layer 130. Although the presence of the interposer layer 329 is not necessary, it facilitates proper growth of the piezoelectric layer 130 and otherwise provides protection of the temperature compensating layer 327 during the fabrication process. Also, for purposes of illustration, the temperature compensating layer 327 is shown as an encapsulated temperature compensating layer, e.g., similar to the encapsulated temperature compensating layer 227 discussed above with reference to FIG. 2. However, it is understood that in alternative configurations, the temperature compensating layer 327 may not be encapsulated, or only partially encapsulated (i.e., having one or more end portions exposed or otherwise not surrounded by any portion of the bottom electrode 320a), within the bottom electrode 320a, without departing from the scope of the present teachings.

The outside electrode layer 326 is formed of the first material (e.g., W) and the second material (e.g., Mo), and the inside electrode layer 328 is formed of the first material. The interposer layer 329 is formed of the second material, as well. The temperature compensating layer 327 may be formed of various materials having positive temperature coefficients, such as BSG, $SiO_2$, Cr or $TeO(x)$, for example.

The outside electrode layer 326 is formed first on the substrate 110, including the integrated low velocity frame 321 and the inner portion 322. More particularly, the integrated low velocity frame 321 may be formed by applying a layer of the first material to a top surface of the substrate 110 and the cavity 115 (before releasing sacrificial material initially filling the cavity 115) using a sputtering, evaporation or CVD technique, for example, to the desired thickness. Then, dry etch is used to define a desired pattern of the first material forming the low velocity frame 321. A thin metal-etch stop layer (300 Å of AlN, for example) (not shown) is deposited over the substrate 110, the cavity 115, and the integrated low velocity frame 321. The second material is deposited over a top surface of the substrate 110, the cavity 115, and the low velocity frame 321 using a sputtering, evaporation or CVD technique, for example, to the desired thickness. The second material is then etched from the low velocity frame 321, following application of a photoresist pattern (e.g., via photolithography), using $SF_6$-based plasma etch, for example, forming the desired frame pattern of the outside electrode layer 326. Finally, CMP using aluminum oxide abrasive, for example, is performed to obtain a desired substantially planar outside electrode layer 326.

A layer of the first material is applied to the etched layer of the second material using a sputtering, evaporation or CVD technique, for example, resulting in formation of the inside electrode layer 328 on the outside electrode layer 326. The temperature compensating layer 327 is formed on all or a portion of the inside electrode layer 328, and the interposer layer 321) is formed on the temperature compensating layer 327 and exposed portions of the inside electrode layer 328 to provide the bottom electrode 320a, as discussed above with reference to FIG. 1A and/or FIG. 2, for example. The piezoelectric layer 130 is then formed on the interposer layer 329. Of course, various other techniques may be incorporated, as would be apparent to one of ordinary skill in the art.

The integrated low velocity frame 321 effectively extends from the inside electrode layer 328 vertically through the outside electrode layer 326 in a direction away from the piezoelectric layer 130, such that the inner portion 322 is at least partially surrounded by the integrated low velocity frame 321. The integrated low velocity frame 321 is therefore located at an outer region of the bottom electrode 320a and the inner portion 322 is located at a center region of the bottom electrode 320a.

Similarly, the top electrode 340, which is a frame composite electrode (with no temperature compensating layer), has multiple electrode layers, including inside electrode layer 346 formed adjacent to the piezoelectric layer 130 and outside electrode layer 348 formed adjacent the inside electrode layer 346. Because the top electrode 340 is formed above the piezoelectric layer 130 in the orientation depicted in FIG. 3A, the inside electrode layer 346 is formed first on the piezoelectric layer 130, and the outside electrode layer 348 is formed on the inside electrode layer 346. As discussed above, the inside electrode layer 346 is formed of the first material and the outside electrode layer 348 is formed of the first and second materials. For example, the inside electrode layer 346 may be formed by applying a layer of the first material to a top surface of the piezoelectric layer 130 using a sputtering, evaporation or CVD technique, for example, to the desired thickness. A thin metal-stop etch layer (300 Å layer of AlN, for example) (not shown) and a layer of the first material is applied to the etched layer of the first material using a sputtering, evaporation or CVD technique, for example. The formation of the outside electrode layer 348, including integrated low velocity frame 341 and inner portion 342, may be performed in a similar manner as formation of the integrated low velocity frame 321 described above, to form the top electrode 340. Of course, various other techniques may be incorporated, as would be apparent to one of ordinary skill in the art.

As a result, the integrated low velocity frame 341 effectively extends vertically from the inside electrode layer 346 through the outside electrode layer 348 in a direction away from the piezoelectric layer 130. The integrated low velocity frame 341 at least partially surrounds an inner portion 342 of the outside electrode layer 348, such that the inner portion 342 is at least partially surrounded by the integrated low velocity frame 341. The integrated low velocity frame 341 is therefore located at an outer region of the top electrode 340 and the inner portion 342 is located at a center region of the top electrode 340.

The operating characteristics of the integrated low velocity frames 321 and 341 may be controlled by adjusting one or more of the widths of the integrated low velocity frames 321 and 341, the thicknesses of the inside electrode layers 328, 346 and the outside electrode layers 326, 348 (which affects the thicknesses of the integrated low velocity frames 321 and 341), and the types of material used to form the inside electrode layers 328, 346 and the outside electrode layers 326, 348. For example, each of the bottom electrode 320a and the top electrode 340 may have a total thickness of approximately 1000 Å to approximately 20000 Å, with each of the inside electrode layers 328, 346 and outside electrode layer 326, 348 being approximately 10 percent to 90 percent fraction of the total thickness of the corresponding bottom or top electrode 320a, 340 at the center region. In various embodiments, the bottom and top electrodes 320a and 340 and corresponding inside electrode layers 328, 346 and outside electrode layers 326, 348 may have the same or different thicknesses from one another. Each of the integrated low velocity frames 321 and 341 may have a width of approximately 0.1 µm to approximately 10 µm, for example. The thicknesses of the integrated low velocity frames 321 and 341 are determined by the relative thicknesses of the outside electrode layers 326 and 348, respectively. In various embodiments, the integrated low velocity frames 321 and 341 may have the same or different widths and thicknesses from one another. In other embodiments the integrated low velocity frames 321 and 341 may be unaligned with respect to each other, as well as may have different widths. The respective dimensions of the bottom and top electrodes 320a and 340, the inside electrode layers 328 and 346, the outside electrode layers 326 and 348, and the integrated low velocity frames 321 and 341, may vary to provide unique benefits for any particular situation or to meet application specific design requirements of various implementations.

The operating characteristics of the temperature compensating layer 327 may likewise be controlled by adjusting one or more of the widths of the temperature compensating layer 327 and the interposer layer 329, and the types of material used to form the temperature compensating layer 327 and the interposer layer 329. For example, the temperature compensating layer 327 may have a thickness of approximately 100 Å to approximately 10000 Å, and the interposer layer 329 may have a thickness of approximately 100 Å to approximately 10000 Å. Generally, temperature compensation characteristics increase as the thickness of the tempera-ture compensating layer 327 increases and/or the thickness of the interposer layer 329 decreases. The respective dimensions of the temperature compensating layer 327 and the interposer layer 329 may vary to provide unique benefits for any particular situation or to meet application specific design requirements of various implementations.

Figure 3B:
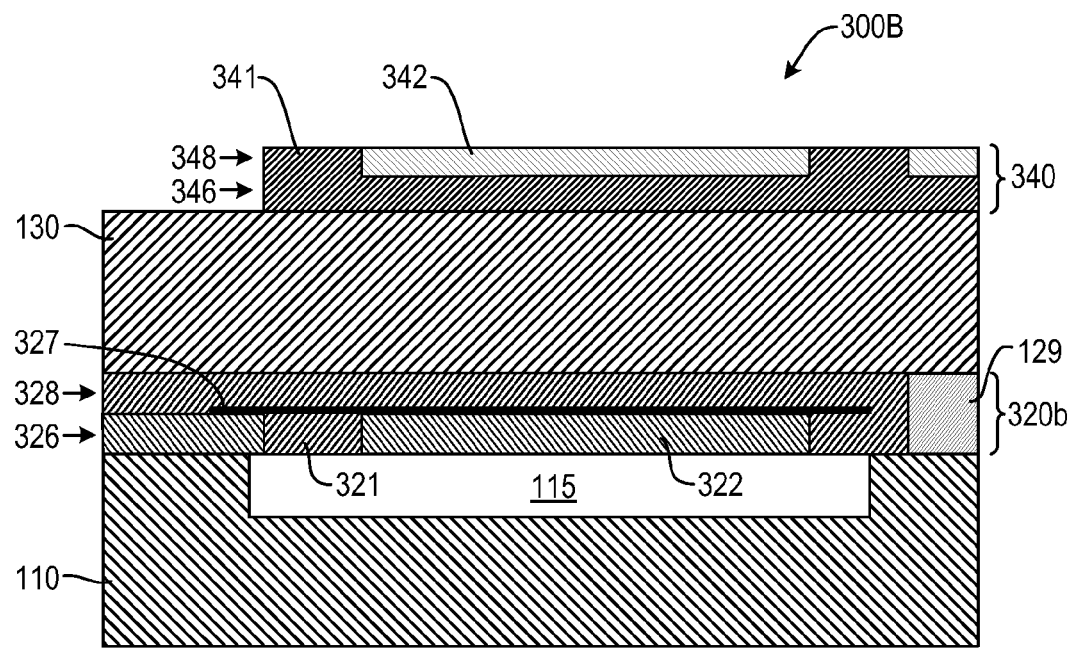

FIG. 3B depicts FBAR 300B, according to a representative embodiment, which is similar to FBAR 300A, except for the location of the temperature compensating layer 327 within the bottom electrode 320b. Referring to FIG. 3B, the bottom electrode 320b is a hybrid composite electrode that includes both integrated lateral features (e.g., integrated low velocity frame 321) and temperature compensation features (e.g., temperature compensating layer 327), while the top electrode 340 is a frame composite electrode that includes only integrated lateral features (e.g., integrated low velocity frame 341), which is the same as discussed above with regard to FBAR 300A.

In the depicted embodiment, the hybrid composite bottom electrode 320b has multiple layers, including outside electrode layer 326, and temperature compensating layer 327 and inside electrode layer 328 stacked in this order on the substrate 110. There is no interposer layer since the inside electrode layer 328 separates the temperature compensating layer 327 from the piezoelectric layer 130. There may be a seed layer (not shown) formed on a top surface of the inside electrode layer 328 to facilitate growth of the piezoelectric layer 130. For purposes of illustration, the temperature compensating layer 327 is shown as an encapsulated temperature compensating layer, similar to the encapsulated temperature compensating layer 227 discussed above with reference to FIG. 2. However, it is understood that in alternative configurations, the temperature compensating layer 327 may not be encapsulated, or only partially encapsulated, within the bottom electrode 320b, without departing from the scope of the present teachings.

The integrated low velocity frame 321 may be formed by applying a layer of the first material to a top surface of the substrate 110 and the cavity 115 (before releasing sacrificial material initially filling the cavity 115) using a sputtering, evaporation or CVD technique, for example, to the desired thickness. Then, dry etch is used to define a desired pattern of the first material forming the low velocity frame 321. A thin metal-etch stop layer (300 Å of AlN, for example) (not shown) is deposited over the substrate 110, the cavity 115, and the integrated low velocity frame 321. The second material is deposited on a top surface of the substrate 110, the cavity 115, and the low velocity frame 321 and over the metal-etch stop layer using a sputtering, evaporation or CVD technique, for example, to the desired thickness. The second material is then etched from the substrate 110 and from the low velocity frame 321, following application of a photoresist pattern (e.g., via photolithography), using $SF_6$-based plasma etch, for example, forming the desired frame pattern of the outside electrode layer 326. Finally, CMP using aluminum oxide abrasive, for example, is performed to obtain a desired substantially planar outside electrode layer 326. The temperature compensating layer 327 is formed on the outside electrode layer 326 as discussed above with reference to FIG. 1A and/or FIG. 2, for example. A layer of the first material is then applied to the temperature compensating layer 327 and exposed portions of the outside electrode layer 326 using a sputtering, evaporation or CVD technique, for example, resulting in formation of the inside electrode layer 328. Of course, various other techniques may be incorporated, as would be apparent to one of ordinary skill in the art.

Figure 3C:
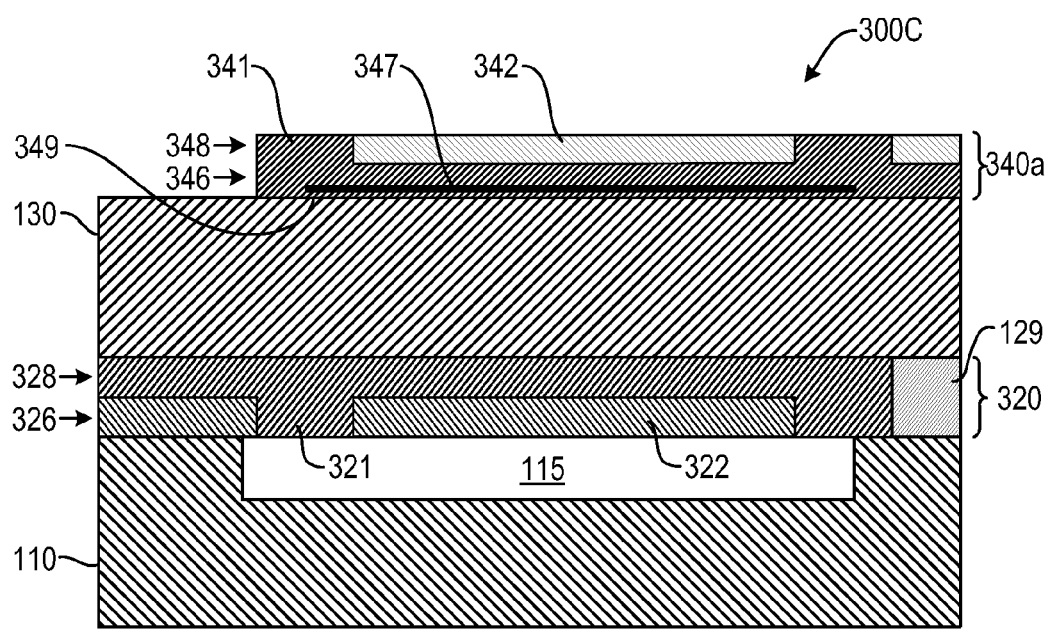

FIG. 3C depicts FBAR 300C, according to a representative embodiment, which is similar to FBAR 300A, except that the top electrode 340a is a hybrid composite electrode and the bottom electrode is a frame composite electrode. Referring to FIG. 3C, the top electrode 340a includes both integrated lateral features (e.g., integrated low velocity frame 341) and temperature compensation features (e.g., temperature compensating layer 347), while the bottom electrode 320 is a frame composite electrode that includes only integrated lateral features (e.g., integrated low velocity frame 321).

With regard to the bottom electrode 320, the outside electrode layer 326, including the integrated low velocity frame 321, may be formed of the first and second materials on a top surface of the substrate 110 and the cavity 115 as discussed above with reference to FIG. 3A. A layer of the first material is then applied to the outside electrode layer 326 using a sputtering, evaporation or CVD technique, for example, resulting in formation of the inside electrode layer 328. The piezoelectric layer 130 is disposed over the inside electrode layer 328. Of course, various other techniques may be incorporated, as would be apparent to one of ordinary skill in the art.

The top electrode 340a is formed using substantially the same process for forming the bottom electrode 320 in FBAR 300A, discussed above, in reverse order. That is, a layer of the first material is applied to the piezoelectric layer 130 using a sputtering, evaporation or CVD technique, for example, resulting in formation of the interposer layer 349. The temperature compensating layer 347 is formed on the interposer layer 349 as discussed above with reference to FIG. 1A and/or FIG. 2, for example. As mentioned above, in alternative embodiments, the temperature compensating layer 347 may be formed directly on the top surface of the piezoelectric layer 130 since the interposer layer 349 is not needed to assist growth of the piezoelectric layer 130, although it does provide protection of the temperature compensating layer 347 and otherwise influences the temperature compensation effects of the temperature compensating layer 347.

A layer of the first material is applied to the temperature compensating layer 347 and exposed portions of the interposer layer 349 using a sputtering, evaporation or CVD technique, for example, resulting in formation of the inside electrode layer 346. The outside electrode layer 348, including the integrated low velocity frame 341, may be formed by applying a layer of the first material to a top surface of the inside electrode layer 346 using a sputtering, evaporation or CVD technique, for example, to the desired thickness. Then, dry etch is used to define a desired pattern of the first material forming the low velocity frame 341. A thin metal-etch stop layer (300 Å of AlN, for example) (not shown) is deposited over the inside electrode layer 346 and the integrated low velocity frame 341. The second material is deposited over the inside electrode layer 346 and the low velocity frame 341 using a sputtering, evaporation or CVD technique, for example, to the desired thickness. The second material is then etched from the low velocity frame 341, following application of a photoresist pattern (e.g., via photolithography), using SF$_6$-based plasma etch, for example, forming the desired frame pattern of the outside electrode layer 348. Finally, CMP using aluminum oxide abrasive, for example, is performed to obtain a desired substantially planar outside electrode layer 348. A passivation layer (not shown) may be formed on the outside electrode layer 348.

The integrated low velocity frame 341 effectively extends from the inside electrode layer 346 vertically through the outside electrode layer 348 in a direction away from the piezoelectric layer 130, such that the inner portion 342 of the outside electrode layer 348 is at least partially surrounded by the integrated low velocity frame 341. The integrated low velocity frame 341 is therefore located at an outer region of the top electrode 340a and the inner portion 342 is located at a center region of the top electrode 340a.

Figure 3D:
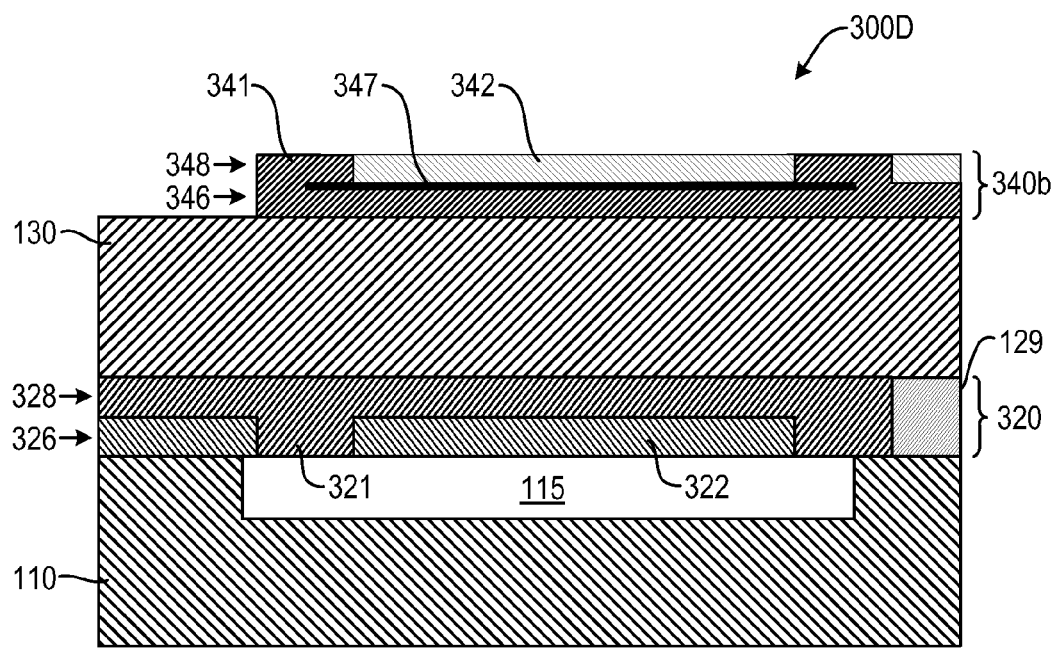

FIG. 3D depicts FBAR 300D, according to a representative embodiment, which is similar to FBAR 300C, except for the location of the temperature compensating layer 347 within the top electrode 340b. Referring to FIG. 3D, the top electrode 340b is a hybrid composite electrode that includes both integrated lateral features (e.g., integrated low velocity frame 341) and temperature compensation features (e.g., temperature compensating layer 347), while the bottom electrode 320) is a frame composite electrode that includes only integrated lateral features (e.g., integrated low velocity frame 321), which is the same as discussed above with regard to FBAR 300C.

In the depicted embodiment, the hybrid composite top electrode 340b has multiple layers, including in electrode layer 346, temperature compensating layer 347 and outside electrode layer 348 stacked in this order on the piezoelectric layer 130. There is no interposer layer since the inside electrode layer 346 separates the temperature compensating layer 347 from the piezoelectric layer 130. For purposes of illustration, the temperature compensating layer 347 is shown as an encapsulated temperature compensating layer, similar to the encapsulated temperature compensating layer 227 discussed above with reference to FIG. 2. However, it is understood that in alternative configurations, the temperature compensating layer 347 may not be encapsulated, or only partially encapsulated, within the bottom electrode 320, without departing from the scope of the present teachings.

The top electrode 340b is formed by applying a layer of the first material to the piezoelectric layer 130 using a sputtering, evaporation or CVD technique, for example, resulting in formation of the inside electrode layer 346. The temperature compensating layer 347 is formed on the inside electrode layer 346 as discussed above with reference to FIG. 1A and/or FIG. 2, for example. The outside electrode layer 348, including the integrated low velocity frame 341, is then formed by applying a layer of the first material to temperature compensating layer 347 and exposed portions of the inside electrode layer 346 using a sputtering, evaporation or CVD technique, for example, to the desired thickness. Then, dry etch is used to define a desired pattern of the first material forming the low velocity frame 341. A thin metal-etch stop layer (300 Å of AlN, for example) (not shown) is deposited over the temperature compensating layer 347, the inside electrode layer 346 and the integrated low velocity frame 341. The second material is deposited on a top surface of the inside electrode layer 346 the low velocity frame 341, and the metal-etch stop layer using a sputtering, evaporation or CVD technique, for example, to the desired thickness. The second material is then etched from the low velocity frame 341, following application of a photoresist patter (e.g., via photolithography), using SF$_6$-based plasma etch, for example, forming the desired frame pattern of the outside electrode layer 348. Finally, CMP using aluminum oxide abrasive, for example, is performed to obtain a desired substantially planar outside electrode layer 348. A passivation layer (not shown) may be formed on the outside electrode layer 348.

As mentioned above, in alternative embodiments, a temperature compensating layer may be located within the piezoelectric layer, as discussed above with reference to piezoelectric layer 130b in FIG. 1C. In such embodiments, the bottom and top electrodes may be frame composite electrodes, such as bottom electrode 320 and top electrode 340. Or, one or both of the bottom and top electrodes may be hybrid composite electrodes, such as bottom electrodes 320a, 320b and top electrodes 340a, 304b.

Referring to FIGS. 3A-3D, in alternative embodiments, high velocity frames may be included in place of one or both of the integrated low velocity frames 321 and 341. Also, in alternative embodiments, each of the FBARs 300A-300D may include only one frame or hybrid composite electrode, having an integrated low (or high) velocity frame 321 or 341, without departing from the scope of the present teachings. In this case, the other electrode may be formed of a single material or multiple materials (without lateral and/or temperature compensation features, or with a different type of lateral feature).

Figure 4A:
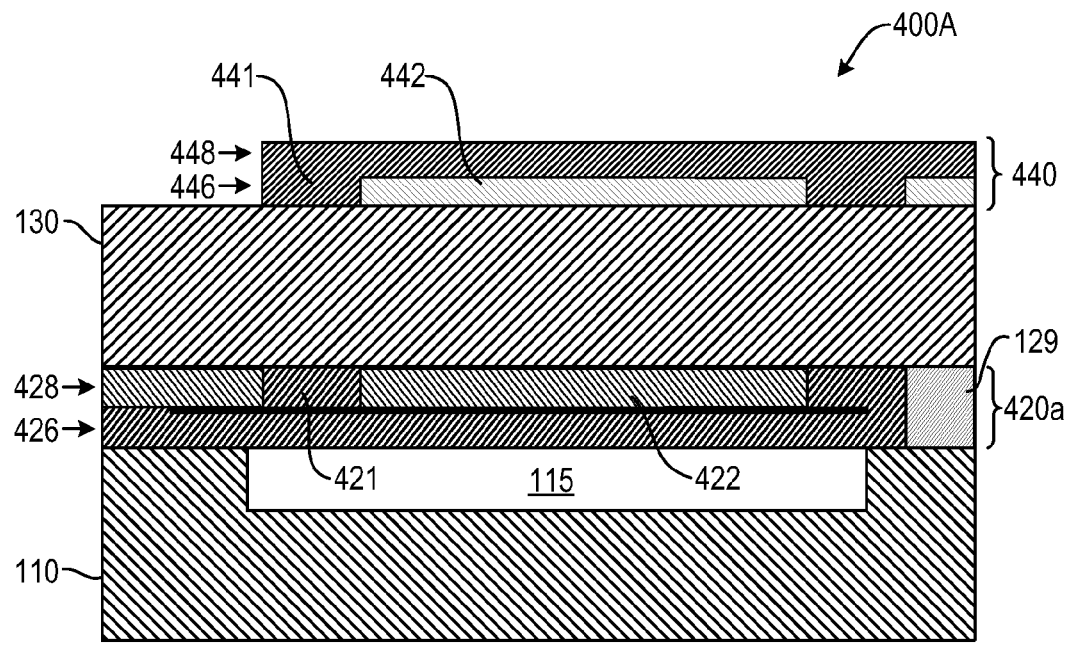
FIGS. 4A-4B are cross-sectional diagrams illustrating acoustic resonators having temperature compensating layers and integrated frames, according to representative embodiments.
Figure 4B:
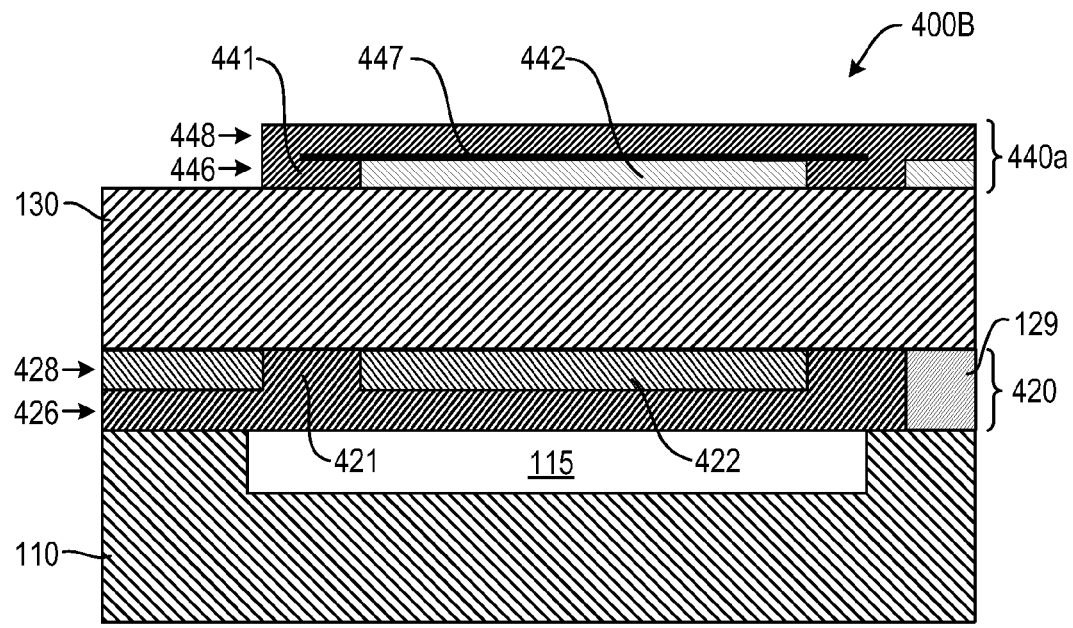

FIGS. 4A-4B are cross-sectional diagrams illustrating acoustic resonators, according to representative embodiments. Each of the acoustic resonators shown in FIGS. 4A-4B includes integrated low velocity frames in both electrodes and a temperature compensating layer in at least one of the electrodes, In alternative embodiments, a temperature compensating layer may be included in the piezoelectric layer (e.g., as shown by piezoelectric layer 130a) in addition to or instead of the top and/or bottom electrodes. However, it is understood that the same general configurations may be included in acoustic resonators having an integrated high velocity frame, in addition to or in place of an integrated low velocity frame, in at least one of the electrodes, respectively, without departing from the scope of the present teachings.

Referring to FIG. 4A, FBAR 400A includes a resonator stack comprising a first or bottom electrode 420a, a piezoelectric layer 130, and a second or top electrode 440 stacked over substrate 110 having a cavity 115 for reflection of acoustic waves. In various alternative configurations, the FBAR 400A may include a known acoustic mirror, such as a Bragg mirror (not shown), in place of the cavity 115, as mentioned above. In the depicted embodiment, the bottom electrode 420a is a hybrid composite electrode in that it includes both integrated lateral features and temperature compensation features, while the top electrode 440 is a frame composite electrode in that includes only integrated lateral features.

More particularly, FBAR 400A includes integrated low velocity frame 421 surrounding inner portion 422 in the bottom electrode 420a, and integrated low velocity frame 441 surrounding inner portion 442 in top electrode 440. The integrated low velocity frames 421 and 441 are formed of the first material and the inner portions 422 and 442 are formed of the second material, where the second material has higher sound velocity than the first material, as discussed above. For example, the integrated low velocity frames 421 and 441 may be formed of W and the inner portions 422 and 442 may be formed of Mo, although other materials may be incorporated without departing from the scope of the present teachings.

In the depicted embodiment, the hybrid composite bottom electrode 420a has multiple electrode layers, including outside electrode layer 426, temperature compensating layer 427, and inside electrode layer 428 stacked in this order on the substrate 110. The inside electrode layer 428 separates the temperature compensating layer 427 from the piezoelectric layer 130, so no interposer layer is needed. A seed layer (not shown) may be included on the top surface of the inside electrode layer 428 to facilitate proper growth of the piezoelectric layer 130. For purposes of illustration, the temperature compensating layer 427 is shown as an encapsulated temperature compensating layer, similar to the encapsulated temperature compensating layer 227 discussed above with reference to FIG. 2. However, it is understood that in alternative configurations, the temperature compensating layer 427 may not be encapsulated, or only partially encapsulated (i.e., having one or more end portions exposed or otherwise not surrounded by any portion of the bottom electrode 420a), within the bottom electrode 420a, without departing from the scope of the present teachings. The outside electrode layer 426 is formed of the first material (e.g., W), and the inside electrode layer 428 is formed of the first material (e.g., W) and the second material (e.g., Mo). The temperature compensating layer 427 may be formed of various materials having positive temperature coefficients, such as BSG, SiO2, Cr or TeO(x), for example.

The bottom electrode 420a is formed on the substrate 110 in substantially the same manner that the top electrode 340b is formed on the piezoelectric layer 130, as described with reference to FIG. 3D. Similarly, the top electrode 440 is formed on the piezoelectric layer 130 in substantially the same manner that the bottom electrode 320 is formed on the substrate 110, as described with reference to FIG. 3D. Accordingly, the details of these processes will not be repeated here.

The integrated low velocity frame 421 effectively extends from the outside electrode layer 426 vertically through the inside electrode layer 428 in a direction toward the piezoelectric layer 130, such that the inner portion 422 of the inside electrode layer 428 is at least partially surrounded by the integrated low velocity frame 421. The integrated low velocity frame 421 is therefore located at an outer region of the bottom electrode 420a and the inner portion 422 is located at a center region of the bottom electrode 420a. Similarly, the integrated low velocity frame 441 of the top electrode 440 effectively extends from the outside electrode layer 448 vertically through the inside electrode layer 446 in a direction toward the piezoelectric layer 130, such that inner portion 442 of the inside electrode layer 446 is at least partially surrounded by the integrated low velocity frame 441. The integrated low velocity frame 441 is therefore located at an outer region of the top electrode 440 and the inner portion 442 is located at a center region of the top electrode 440.

FIG. 4B depicts FBAR 400B, according to a representative embodiment, which is similar to FBAR 400A, except that the top electrode 440a is a hybrid composite electrode and the bottom electrode 420 is a frame composite electrode. Referring to FIG. 4B, the top electrode 440a includes both integrated lateral features (e.g., integrated low velocity frame 441) and temperature compensation features (e.g., temperature compensating layer 447), while the bottom electrode 420 is a frame composite electrode that includes only integrated lateral features (e.g., integrated low velocity frame 421).

More particularly, FBAR 400A includes integrated low velocity frame 421 surrounding inner portion 422 in the bottom electrode 420, and integrated low velocity frame 441 surrounding inner portion 442 in top electrode 440a. The integrated low velocity frames 421 and 441 are formed of the first material and the inner portions 422 and 442 are formed of the second material, where the second material has higher sound velocity than the first material, as discussed above. For example, the integrated low velocity frames 421 and 441 may be formed of W and the inner portions 422 and 442 may be formed of Mo, although other materials may be incorporated without departing from the scope of the present teachings.

In the depicted embodiment, the hybrid composite top electrode 440a has multiple electrode layers, including inside electrode layer 446, temperature compensating layer 447, and outside electrode layer 448 stacked in this order on the piezoelectric layer 130. The inside electrode layer 446 separates the temperature compensating layer 447 from the piezoelectric layer 130, so no interposer layer is needed. For purposes of illustration, the temperature compensating layer 447 is shown as an encapsulated temperature compensating layer, similar to the encapsulated temperature compensating layer 227 discussed above with reference to FIG. 2. However, it is understood that in alternative configurations, the temperature compensating layer 427 may not be encapsulated, or only partially encapsulated, within the bottom electrode 420, without departing from the scope of the present teachings. The inside electrode layer 446 is formed of the first material (e.g., W) and the second material. (e.g., Mo), and the outside electrode layer 448 is formed of the first material. The temperature compensating layer 427 may be formed of various materials having positive temperature coefficients, such as BSG, SiO2, Cr or TeO(x), for example.

The top electrode 440a is formed on the piezoelectric layer 130 in substantially the same manner that the bottom electrode 320b is formed on the substrate 110, as described with reference to FIG. 3B. The bottom electrode 420 is formed on the substrate 110 in substantially the same manner that the top electrode 340 is formed on the piezoelectric layer 130, also as described with reference to FIG. 3B. Accordingly, the details of these processes will not be repeated here.

As mentioned above, in alternative embodiments, a temperature compensating layer may be located within the piezoelectric layer, as discussed above with reference to piezoelectric layer 130b in FIG. 1C. In such embodiments, the bottom and top electrodes may be frame composite electrodes, such as bottom electrode 420 and top electrode 440. Or, one or both of the bottom and top electrodes may be hybrid composite electrodes, such as bottom electrode 420a and top electrode 340a.

Referring to FIGS. 4A-4B, in alternative configurations, high velocity frames may be included in place of one or both of the integrated low velocity frames 421 and 441. Also, in alternative configurations, each of the FBARs 400A-400B may include only one composite electrode, without departing from the scope of the present teachings. When only one of the electrodes includes an integrated low (or high) velocity frame, the other electrode may be formed of a single material or multiple materials (without lateral and/or temperature compensation features, or with a different type of lateral feature).

FIGS. 5A-5D are cross-sectional diagrams illustrating acoustic resonators, according to representative embodiments. Each of the acoustic resonators shown in FIGS. 5A-5D includes integrated low velocity frames in both electrodes and a temperature compensating layer in at least one of the electrodes. In alternative embodiments, a temperature compensating layer may be included in the piezoelectric layer (e.g., as shown by piezoelectric layer 130a) in addition to or instead of the top and/or bottom electrodes. It is understood that the same general configurations may be included in acoustic resonators having an integrated high velocity frame, in addition to or in place of an integrated low velocity frame, in at least one of the electrodes, respectively, without departing from the scope of the present teachings.

Figure 5A:
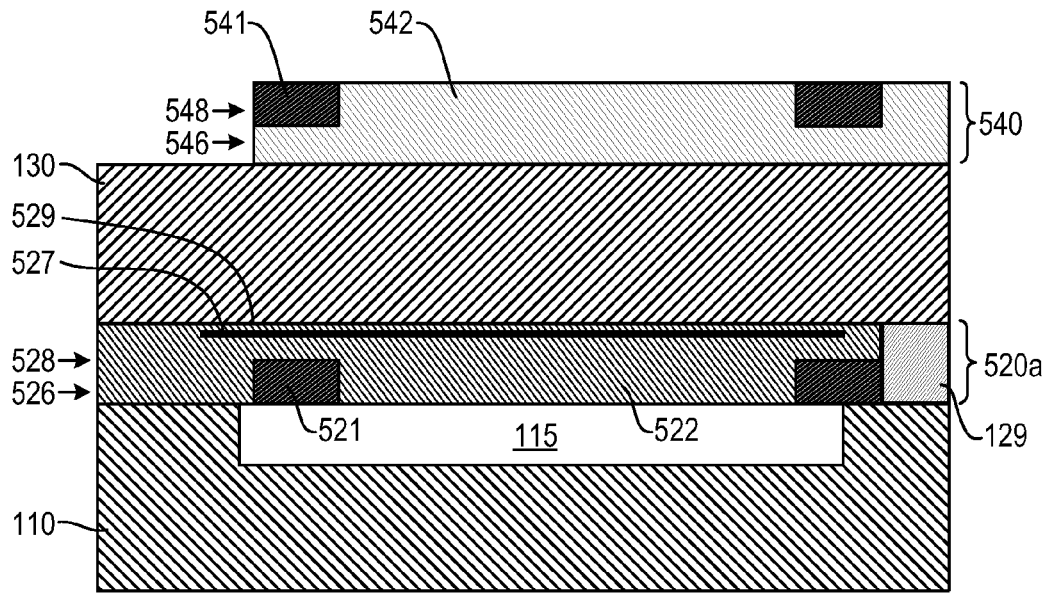
FIGS. 5A-5D are cross-sectional diagrams illustrating acoustic resonators having temperature compensating layers and integrated frames, according to representative embodiments.

Referring to FIG. 5A, FBAR 500A includes a resonator stack comprising a first or bottom electrode 520a, a piezoelectric layer 130, and a second or top electrode 540 stacked over substrate 110 having a cavity 115 for reflection of acoustic waves. In various alternative configurations, the FBAR 500A may include a known acoustic mirror, such as a Bragg mirror (not shown), in place of the cavity 115, as mentioned above. In the depicted embodiment, the bottom electrode 520a is a hybrid composite electrode in that it includes both integrated lateral features and temperature compensation features, while the top electrode 540 is a frame composite electrode in that includes only integrated lateral features.

More particularly, FBAR 500A includes integrated low velocity frame 521 surrounding inner portion 522 in the bottom electrode 520a, and integrated low velocity frame 541 surrounding inner portion 542 in top electrode 540. The integrated low velocity frames 521 and 541 are formed of the first material and the inner portions 522 and 542 are formed of the second material, where the second material has higher sound velocity than the first material, as discussed above. For example, the integrated low velocity frames 521 and 541 may be formed of W and the inner portions 522 and 542 may be formed of Mo, although other materials may be incorporated without departing from the scope of the present teachings.

In the depicted embodiment, the hybrid composite bottom electrode 520a has multiple electrode layers, including outside electrode layer 526, inside electrode layer 528, temperature compensating layer 527 and interposer layer 529 stacked in this order on the substrate 110. The interposer layer 529 separates the temperature compensating layer 527 from the piezoelectric layer 130. Although the presence of the interposer layer 529 is not necessary, it facilitates proper growth of the piezoelectric layer 130 and otherwise provides protection of the temperature compensating layer 527 during the fabrication process. Also, for purposes of illustration, the temperature compensating layer 527 is shown as an encapsulated temperature compensating layer, similar to the encapsulated temperature compensating layer 227 discussed above with reference to FIG. 2. However, it is understood that in alternative configurations, the temperature compensating layer 527 may not be encapsulated, or only partially encapsulated, within the bottom electrode 520a, without departing from the scope of the present teachings.

Generally, the outside electrode layer 526 is formed first on the substrate 110, and the inside electrode layer 528 is then formed on the outside electrode layer 526. The temperature compensating layer 527 is formed on all or a portion of the inside electrode layer 528, and the interposer layer 529 is formed on the temperature compensating layer 527 and exposed portions of the inside electrode layer 528 to provide the bottom electrode 520a. The piezoelectric layer 130 is then formed on the interposer layer 529.

For example, with regard to the outside electrode layer 526, the integrated low velocity frame 521 may be formed by applying a layer of the first material to a top surface of the substrate 110 and the cavity 115 (before releasing sacrificial material initially filling the cavity 115) using a sputtering, evaporation or CVD technique, for example, to the desired thickness. Then, dry etch is used to define a desired pattern of the first material forming the integrated low velocity frame 521. A thin metal-etch stop layer (300 Å of AlN, for example) (not shown) is deposited over the substrate 110, the cavity 115, and the integrated low velocity frame 521. The second material is then deposited on a top surface of the substrate 110, the cavity 115, and the low velocity frame 521 and over the metal-etch stop layer using a sputtering, evaporation or CVD technique, for example, to the desired thickness. The second material is then etched from the substrate 110 and from the low velocity frame 521, following application of a photoresist pattern (e.g., via photolithography), using $SF_6$-based plasma etch, for example, forming the desired outside electrode layer 526 pattern. Finally, CMP using aluminum oxide abrasive, for example, is performed to obtain a desired substantially planar outside electrode layer 526. A layer of the second material is applied to the outside electrode layer 526 using a sputtering, evaporation or CVD technique, for example, resulting in formation of the inside electrode layer 528. The temperature compensating layer 527 and the interposer layer 529 are formed on the inside electrode layer 528 as discussed above with reference to FIG. 1A and/or FIG. 2, for example. Of course, various other techniques may be incorporated, as would be apparent to one of ordinary skill in the art.

As a result, the integrated low velocity frame 521 is effectively embedded in the bottom electrode 520a. The inner portion 522 of the outside electrode layer 526 is at least partially surrounded by the integrated low velocity frame 521 of the outside electrode layer 526. The integrated low velocity frame 521 is therefore located at an outer region of the bottom electrode 520a and the inner portion 522 is located at a center region of the bottom electrode 520a. Notably, the integrated low velocity frame 521 is similar to the integrated low velocity frame 121 in FBAR 100B, discussed above with reference to FIG. 1B, except that the integrated low velocity frame 521 does not pass through the entire thickness of the bottom electrode 520a. Therefore, the thickness of the integrated low velocity frame 521 may be varied (by varying the thickness of the outside electrode layer 526) without varying the total thickness of the bottom electrode 520a.

Similarly, the frame composite top electrode 540 has multiple electrode layers, including an inside electrode layer 546 formed adjacent to the piezoelectric layer 130 and an outside electrode layer 548 formed adjacent the inside electrode layer 546. Because the top electrode 540 is formed above the piezoelectric layer 130 in the orientation depicted in FIG. 5, the inside electrode layer 546 is formed first on the piezoelectric layer 130, and the outside electrode layer 548 is formed on the inside electrode layer 546. For example, the inside electrode layer 546 may be formed by applying a layer of the second material to a top surface of the piezoelectric layer 130 using a sputtering, evaporation or CVD technique, for example, to the desired thickness. A thin metal-etch stop layer (300 Å of AlN, for example) (not shown) may be then deposited. The formation of the integrated low velocity frame 541 as part of the outside layer 548 may be then performed in a similar manner as formation of the integrated low velocity frame 521, discussed above. Of course, various other techniques may be incorporated, as would be apparent to one of ordinary skill in the art.

As a result, the integrated low velocity frame 541 is effectively embedded in the top electrode 540. The integrated low velocity frame 541 at least partially surrounds inner portion 542 of the outside electrode layer 548. The integrated low velocity frame 541 is therefore located at an outer region of the top electrode 540 and the inner portion 542 is located at a center region of the top electrode 540. As discussed above in regard to the integrated low velocity frame 521, the integrated low velocity frame 541 is similar to the integrated low velocity frame 141 in FBAR 100A, except that the integrated low velocity frame 541 does not pass through the entire thickness of the top electrode 540. Therefore, the thickness of the integrated low velocity frame 541 may be varied (by varying the thickness of the outside electrode layer 548) without varying the total thickness of the top electrode 540.

Figure 5B:
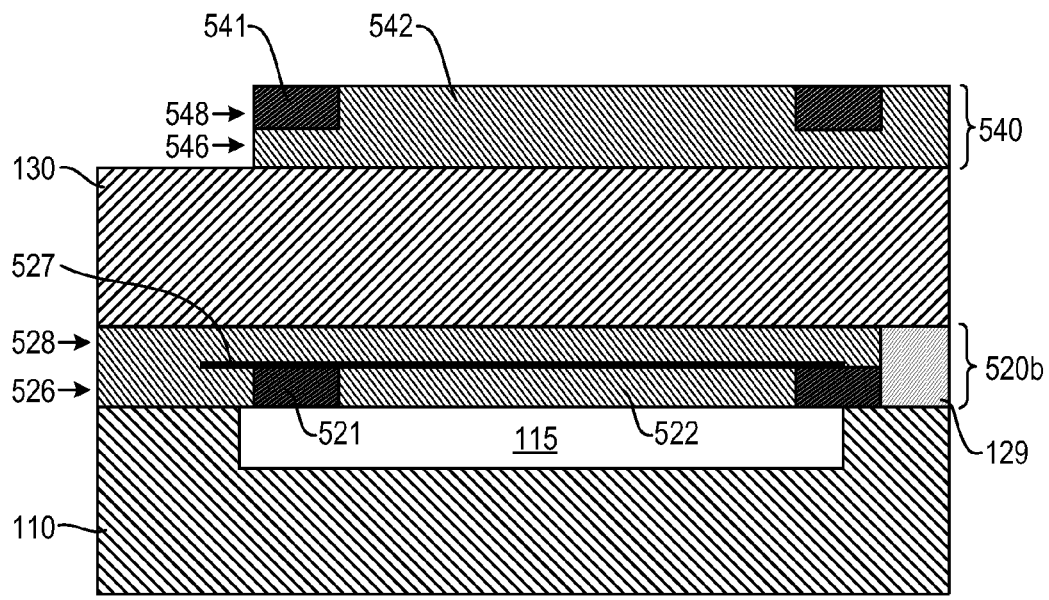

FIG. 5B depicts FBAR 500B, according to a representative embodiment, which is similar to FBAR 500A, except for the location of the temperature compensating layer 527 within the bottom electrode 520b. Referring to FIG. 5B, the bottom electrode 520b is a hybrid composite electrode that includes both integrated lateral features (e.g., integrated low velocity frame 521) and temperature compensation features (e.g., temperature compensating layer 527), while the top electrode 540 is a frame composite electrode that includes only integrated lateral features (e.g., integrated low velocity frame 541), which is the same as discussed above with regard to FBAR 500A.

In the depicted embodiment, the hybrid composite bottom electrode 520b has multiple layers, including outside electrode layer 526, temperature compensating layer 527 and inside electrode layer 528 stacked in this order on the substrate 110. There is no interposer layer since the inside electrode layer 528 separates the temperature compensating layer 527 from the piezoelectric layer 130. There may be a seed layer (not shown) formed on a top surface of the inside electrode layer 528 to facilitate growth of the piezoelectric layer 130. For purposes of illustration, the temperature compensating layer 527 is shown as an encapsulated temperature compensating layer, similar to the encapsulated temperature compensating layer 227 discussed above with reference to FIG. 2. However, it is understood that in alternative configurations, the temperature compensating layer 527 may not be encapsulated, or only partially encapsulated, within the bottom electrode 520b, without departing from the scope of the present teachings.

The outside electrode layer 526, including the integrated low velocity frame 521, may be formed as described above with reference to the bottom electrode 520a. The temperature compensating layer 527 may be formed on the outside electrode layer 526 as discussed above with reference to the temperature compensating layer 127 and/or 227 as described above with reference FIG. 1A and/or FIG. 2, for example. A layer of the second material is applied to the temperature compensating layer and exposed portions of the outside electrode layer 526 using a sputtering, evaporation or CVD technique, for example, resulting in formation of the inside electrode layer 528. Of course, various other techniques may be incorporated, as would be apparent to one of ordinary skill in the art.

Figure 5C:
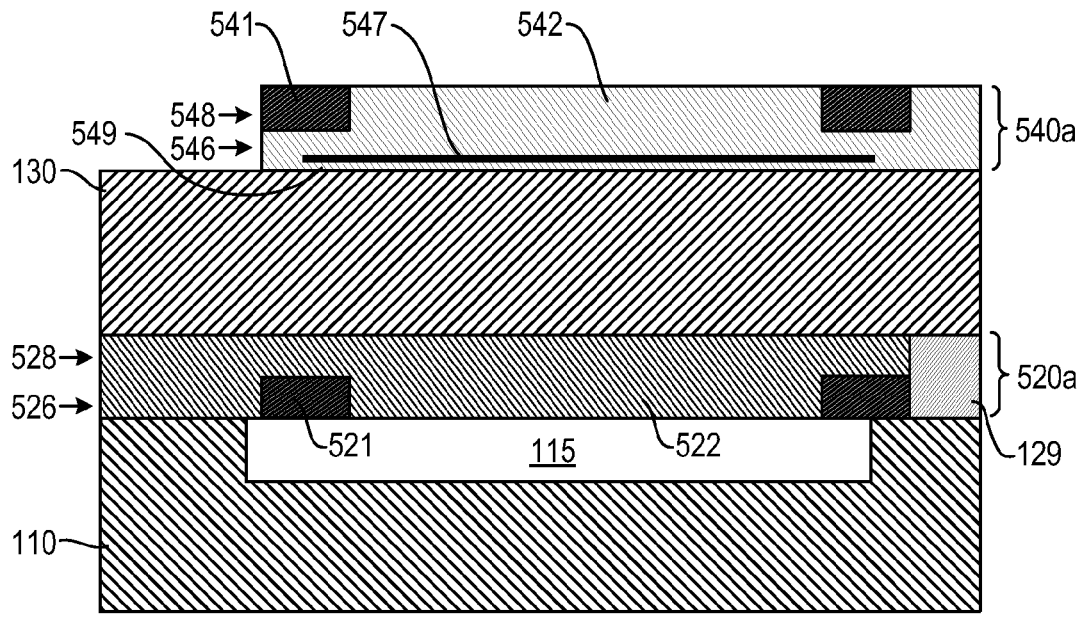

FIG. 5C depicts FBAR 500C, according to a representative embodiment, which is similar to FBAR 500A, except that the top electrode 540a is a hybrid composite electrode and the bottom electrode 520 is a frame composite electrode. Referring to FIG. 5C, the top electrode 540a includes both integrated lateral features (e.g., integrated low velocity frame 541) and temperature compensation features (e.g., temperature compensating layer 547), while the bottom electrode 520 is a frame composite electrode that includes only integrated lateral features (e.g., integrated low velocity frame 521).

With regard to the bottom electrode 520, the outside electrode layer 526, including the integrated low velocity frame 521, may be formed of the first and second materials on a top surface of the substrate 110 and the cavity 115 as discussed above with reference to FIG. 5A. A layer of the second material is then applied to the outside electrode layer 526 using a sputtering, evaporation or CVD technique, for example, resulting in formation of the inside electrode layer 528. The piezoelectric layer 130 is disposed over the inside electrode layer 528. Of course, various other techniques may be incorporated, as would be apparent to one of ordinary skill in the art.

The top electrode 540a is formed using substantially the same process for forming the bottom electrode 520a in FBAR 500A, discussed above, in reverse order. That is, a layer of the second material is applied to the piezoelectric layer 130 using a sputtering, evaporation or CVD technique, for example, resulting in formation of the interposer layer 549. The temperature compensating layer 547 is formed on the interposer layer 529 as discussed above with reference to FIG. 1A and/or FIG. 2, for example. As mentioned above, in alternative embodiments, the temperature compensating layer 547 may be formed directly on the top surface of the piezoelectric layer 130 since the interposer layer 549 is not needed to assist growth of the piezoelectric layer 130, although it does provide protection of the temperature compensating layer 547 and otherwise influences the temperature compensation effects of the temperature compensating layer 547. For purposes of illustration, the temperature compensating layer 547 is shown as an encapsulated temperature compensating layer, similar to the encapsulated temperature compensating layer 227 discussed above with reference to FIG. 2. However, it is understood that in alternative configurations, the temperature compensating layer 547 may not be encapsulated, or only partially encapsulated, within the top electrode 540b, without departing from the scope of the present teachings.

A layer of the second material is applied to the temperature compensating layer 547 and exposed portions of the interposer layer 549 using a sputtering, evaporation or CVD technique, for example, resulting in formation of the inside electrode layer 546. The outside electrode layer 548, including the integrated low velocity frame 541, may be formed by applying a layer of the first material to a top surface of the inside electrode layer 546 using a sputtering, evaporation or CVD technique, for example, to the desired thickness. Then, dry etch is used to define a desired pattern of the first material forming the integrated low velocity frame 541. A thin metal-etch stop layer (300 Å of AlN, for example) (not shown) is deposited over the inside electrode layer 546 and the integrated low velocity frame 541. The second material is deposited over the inside electrode layer 546 and the integrated low velocity frame 541 using a sputtering, evaporation or CVD technique, for example, to the desired thickness. The second material is then etched from the integrated low velocity frame 541, following application of a photoresist pattern (e.g., via photolithography), using $SF_6$-based plasma etch, for example, forming the desired frame pattern of the outside electrode layer 548. Finally, CMP using aluminum oxide abrasive, for example, is performed to obtain a desired substantially planar outside electrode layer 548. A passivation layer (not shown) may be formed on the outside electrode layer 548.

Figure 5D:
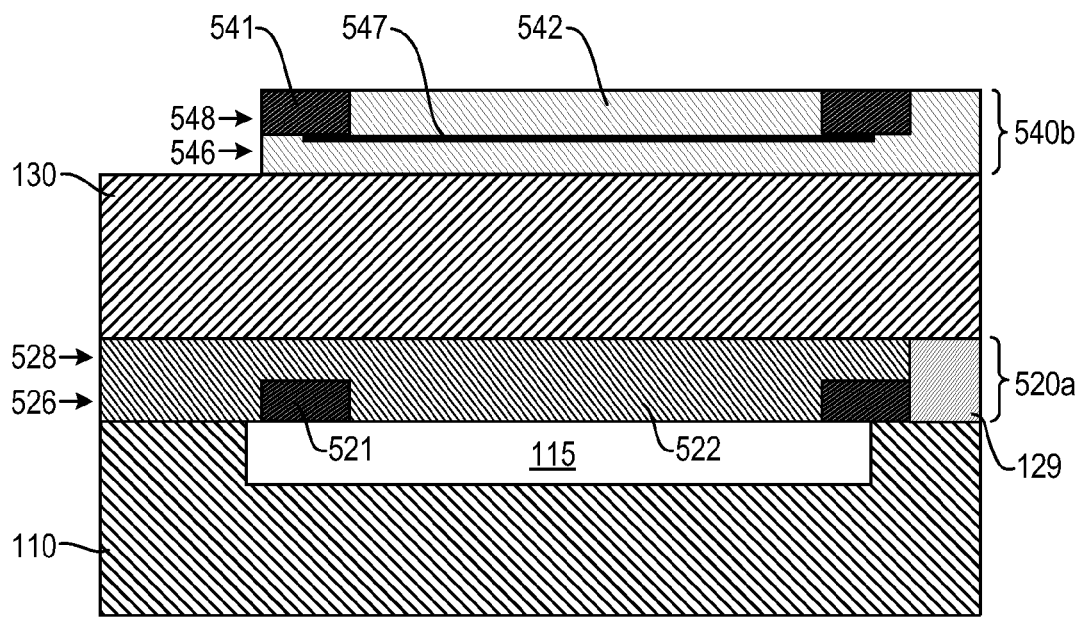

FIG. 5D depicts FBAR 500D, according to a representative embodiment, which is similar to FBAR 500C, except for the location of the temperature compensating layer 547 within the top electrode 540b. Referring to FIG. 5D, the top electrode 540b is a hybrid composite electrode that includes both integrated lateral features (e.g., integrated low velocity frame 541) and temperature compensation features (e.g., temperature compensating layer 547), while the bottom electrode 520 is a frame composite electrode that includes only integrated lateral features (e.g., integrated low velocity frame 521), which is the same as discussed above with regard to FBAR 500C.

In the depicted embodiment, the hybrid composite top electrode 540b has multiple layers, including inside electrode layer 546, temperature compensating layer 547 and outside electrode layer 548 stacked in this order on the piezoelectric layer 130. There is no interposer layer since the inside electrode layer 546 separates the temperature compensating layer 547 from the piezoelectric layer 130. For purposes of illustration, the temperature compensating layer 547 is shown as an encapsulated temperature compensating layer, similar to the encapsulated temperature compensating layer 227 discussed above with reference to FIG. 2. However, it is understood that in alternative configurations, the temperature compensating layer 547 may not be encapsulated, or only partially encapsulated, within the top electrode 540b, without departing from the scope of the present teachings.

The top electrode 540b is formed by applying a layer of the second material to the piezoelectric layer 130 using a sputtering, evaporation or CVD technique, for example, resulting in formation of the inside electrode layer 546. The temperature compensating layer 547 is formed on the inside electrode layer 546 as discussed above with reference to FIG. 1A and/or FIG. 2, for example. The outside electrode layer 548, including the integrated low velocity frame 541, is then formed on the temperature compensating layer 547 and exposed portions of the inside electrode layer 546 as described above with reference to the top electrode 540a. A passivation layer (not shown) may be formed on the outside electrode layer 348.

As mentioned above, in alternative embodiments, a temperature compensating layer may be located within the piezoelectric layer, as discussed above with reference to piezoelectric layer 130b in FIG. 1C. In such embodiments, the bottom and top electrodes may be frame composite electrodes, such as bottom electrode 520 and top electrode 540. Or, one or both of the bottom and top electrodes may be hybrid composite electrodes, such as bottom electrode 520a, 520b and top electrode 540a, 540b.

Referring to FIGS. 5A-5D, in alternative configurations, high velocity frames may be included in place of one or both of the integrated low velocity frames 521 and 541. Also, in alternative configurations, each of the FBARs 500A-500E may include only one composite electrode, without departing from the scope of the present teachings. When only one of the electrodes includes an integrated low (or high) velocity frame, the other electrode may be formed of a single material or multiple materials (without lateral and/or temperature compensation features, or with a different type of lateral feature).

Figure 6A:
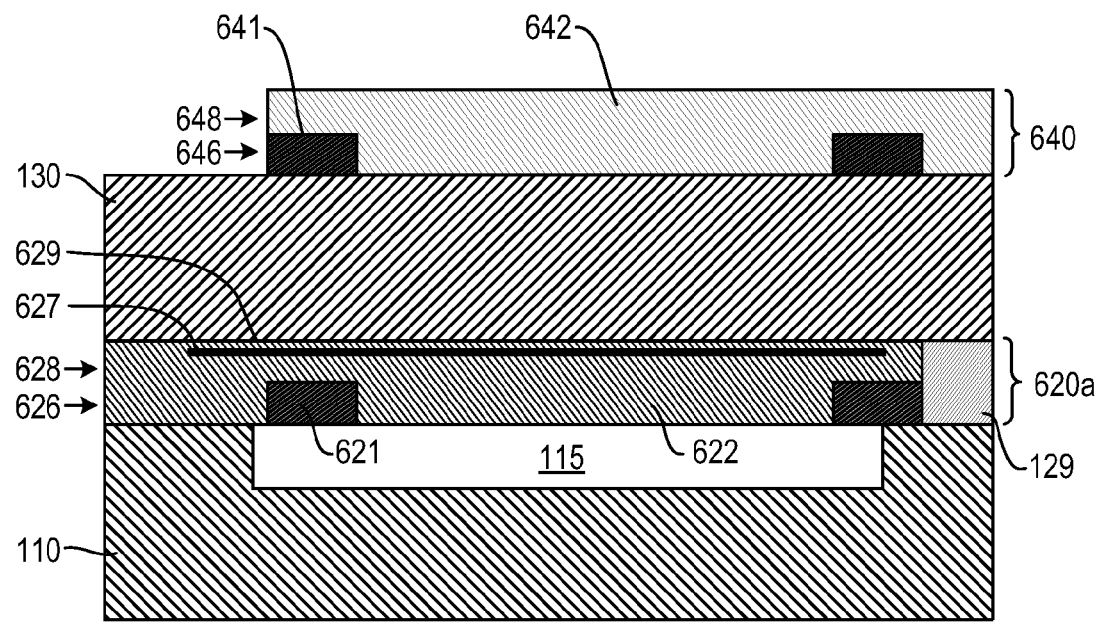
FIGS. 6A-6C are cross-sectional diagrams illustrating acoustic resonators having temperature compensating layers and integrated frames, according to representative embodiments.
Figure 6B:
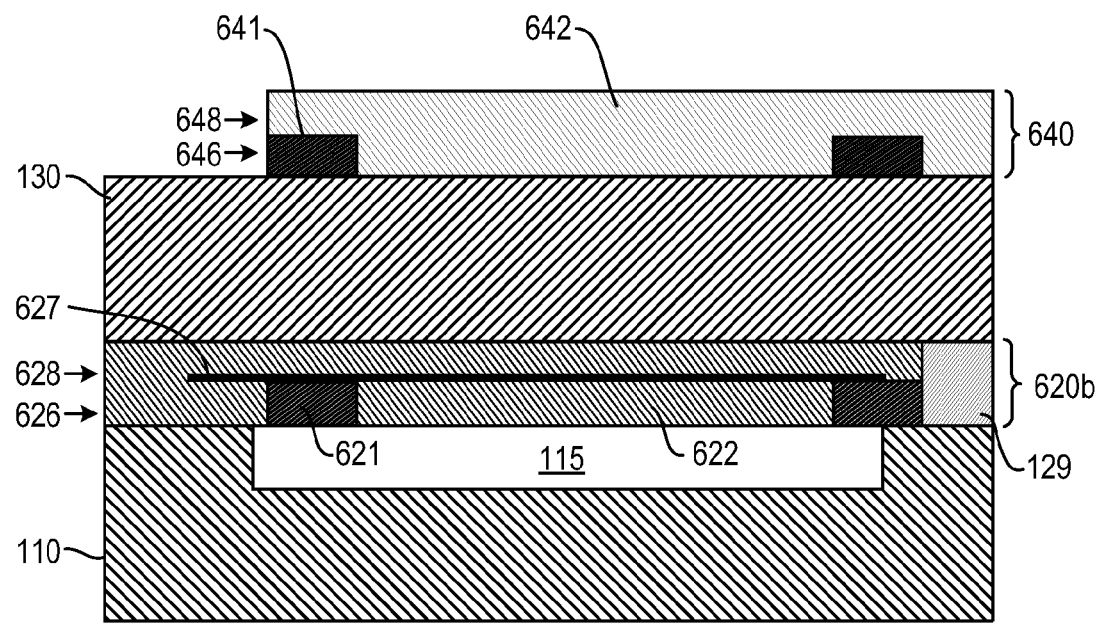
Figure 6C:
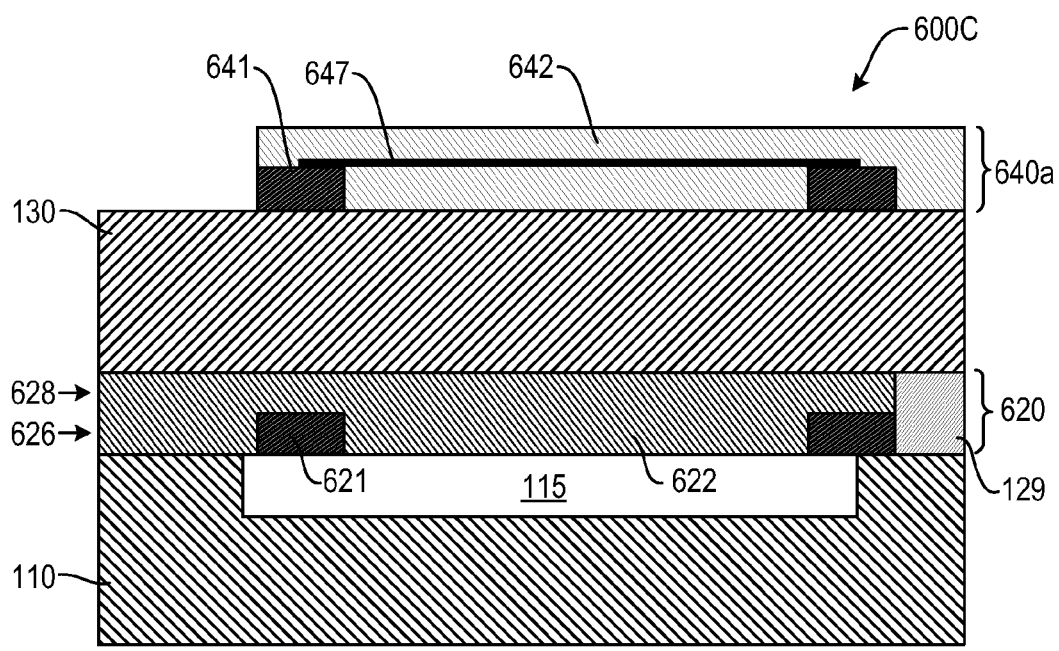

FIGS. 6A-6C are cross-sectional diagrams illustrating acoustic resonators, according to representative embodiments. Each of the acoustic resonators shown in FIGS. 6A-6C includes integrated low velocity frames in both electrodes and a temperature compensating layer in at least one of the electrodes. In alternative embodiments, a temperature compensating layer may be included in the piezoelectric layer (e.g., as shown by piezoelectric layer 130a) in addition to or instead of the top and/or bottom electrodes. It is understood that the same general configurations may be included in acoustic resonators having an integrated high velocity frame, in addition to or in place of an integrated low velocity frame, in at least one of the electrodes, respectively, without departing from the scope of the present teachings.

Referring to FIG. 6A, FBAR 600A includes a resonator stack comprising a first or bottom electrode 620a, a piezoelectric layer 130, and a second or top electrode 640 stacked over substrate 110 having a cavity 115 for reflection of acoustic waves. In various alternative configurations, the FBAR 600A may include a known acoustic mirror, such as a Bragg mirror (not shown), in place of the cavity 115, as mentioned above. In the depicted embodiment, the bottom electrode 620a is a hybrid composite electrode in that it includes both integrated lateral features and temperature compensation features, while the top electrode 640 is a frame composite electrode in that includes only integrated lateral features.

More particularly, the bottom electrode 620a of the FBAR 600A is substantially the same as the bottom electrode 520a of the FBAR 500A discussed above. Therefore, details regarding the configuration and formation of the bottom electrode 620a will not be repeated. The top electrode 640 of the FBAR 600A is similar to the top electrode 540 of the FBAR 500A, except that the integrated low velocity frame 641 surrounding inner portion 642 is in the inner electrode layer 646 (as opposed to the outer electrode layer). The integrated low velocity frame 641 is formed of the first material and the inner portion 642 is formed of the second material, where the second material has higher sound velocity than the first material, as discussed above. For example, the integrated low velocity frame 641 may be formed of W and the inner portion 642 may be formed of Mo, although other materials may be incorporated without departing from the scope of the present teachings. The top electrode 640 is formed on the piezoelectric layer 130 in substantially the same manner that the bottom electrode 520 is formed on the substrate 110, as described with reference to FIG. 5C. Accordingly, the details of these processes will not be repeated here.

Referring to FIG. 6B, FBAR 600B includes a resonator stack comprising a first or bottom electrode 620b, a piezoelectric layer 130, and a second or top electrode 640 stacked over substrate 110 having a cavity 115 for reflection of acoustic waves. In various alternative configurations, the FBAR 600A may include a known mirror, such as a Bragg mirror (not shown), in place of the cavity 115, as mentioned above. In the depicted embodiment, the bottom electrode 620a is a hybrid composite electrode in that it includes both integrated lateral features and temperature compensation features, while the top electrode 640 is a frame composite electrode in that includes only integrated lateral features.

The FBAR 600B is substantially the same as the FBAR 600A except for the location of the temperature compensating layer 627 within the bottom electrode 620b. More particularly, the bottom electrode 620b is substantially the same as the bottom electrode 520b in FBAR 500B discussed above. Therefore, details regarding the configuration and formation of the bottom electrode 520b will not be repeated.

FIG. 6C depicts FBAR 600C, according to a representative embodiment, which is similar to FBAR 600A, except that the top electrode 640a is a hybrid composite electrode and the bottom electrode 620 is a frame composite electrode. Referring to FIG. 6C, the top electrode 640a includes both integrated lateral features (e.g., integrated low velocity frame 641) and temperature compensation features (e.g., temperature compensating layer 647), while the bottom electrode 620 is a frame composite electrode that is substantially the same as the bottom electrode 520 of the FBAR 500C discussed above.

In the depicted embodiment, the hybrid composite top electrode 640a has multiple layers, including inside electrode layer 646, temperature compensating layer 647 and outside electrode layer 648 stacked in this order on the piezoelectric layer 130. For purposes of illustration, the temperature compensating layer 647 is shown as an encapsulated temperature compensating layer, similar to the encapsulated temperature compensating layer 227 discussed above with reference to FIG. 2. However, it is understood that in alternative configurations, the temperature compensating layer 647 may not be encapsulated, or only partially encapsulated, within the top electrode 640a, without departing from the scope of the present teachings.

For example, with regard to the inside electrode layer 646, the integrated low velocity frame 641 may be formed by applying a layer of the first material to a top surface of the piezoelectric layer 130 using a sputtering, evaporation or CVD technique, for example, to the desired thickness. Then, dry etch is used to define a desired pattern of the first material forming the integrated low velocity frame 641. A thin metal-etch stop layer (300 Å of AlN, for example) (not shown) is deposited over the piezoelectric layer 130 and the integrated low velocity frame 641. The second material is then deposited on a top surface of the piezoelectric layer 130 and the low velocity frame 641 and over the metal-etch stop layer using a sputtering, evaporation or CVD technique, for example, to the desired thickness. The second material is then etched from the piezoelectric layer 130 and from the low velocity frame 641, following application of a photoresist pattern (e.g., via photolithography), using $SF_6$-based plasma etch, for example, forming the desired inside electrode layer 646 pattern. Finally, CMP using aluminum oxide abrasive, for example, is performed to obtain a desired substantially planar inside electrode layer 646. The temperature compensating layer 647 is formed on the outside electrode layer 646 as discussed above with reference to FIG. 1A and/or FIG. 2, for example. A layer of the second material is applied to the temperature compensating layer 647 and exposed portions of the inside electrode layer 646 using a sputtering, evaporation or CVD technique, for example, resulting in formation of the outside electrode layer 648. Of course, various other techniques may be incorporated, as would be apparent to one of ordinary skill in the art.

For purposes of illustration, the temperature compensating layer 647 is shown as an encapsulated temperature compensating layer, similar to the encapsulated temperature compensating layer 227 discussed above with reference to FIG. 2. However, it is understood that in alternative configurations, the temperature compensating layer 647 may not be encapsulated, or only partially encapsulated, within the top electrode 640a, without departing from the scope of the present teachings.

As mentioned above, in alternative embodiments, a temperature compensating layer may be located within the piezoelectric layer, as discussed above with reference to piezoelectric layer 130b in FIG. 1C. In such embodiments, the bottom and top electrodes may be frame composite electrodes, such as bottom electrode 620 and top electrode 640. Or, one or both of the bottom and top electrodes may be hybrid composite electrodes, such as bottom electrode 620a, 620b and top electrode 640a.

Referring to FIGS. 6A-6C, in alternative configurations, high velocity frames may be included in place of one or both of the integrated low velocity frames 621 and 641. Also, in alternative configurations, each of the FBARs 600A-600C may include only one composite electrode, without departing from the scope of the present teachings. When only one of the electrodes includes an integrated low (or high) velocity frame, the other electrode may be formed of a single material or multiple materials (without lateral and/or temperature compensation features, or with a different type of lateral feature).

Further, in various embodiments in addition to those discussed above with reference to FIGS. 3A-6C, the temperature compensating layer may be included in a tempco composite electrode having no lateral features. An example of this configuration is depicted in each of FIG. 1A and FIG. 1B, which depicts one electrode being a tempco composite electrode (bottom electrode 120a, top electrode 140a) while the other electrode is a frame composite electrode (bottom electrode 120, top electrode 140).

Figure 7:
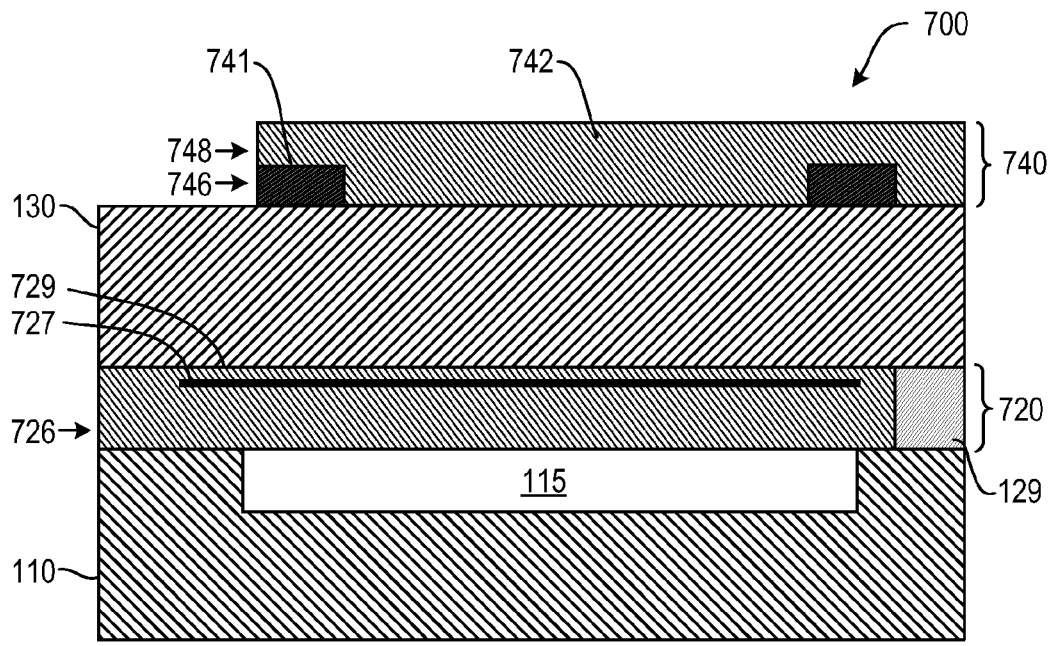
FIG. 7 is a cross-sectional diagram illustrating an acoustic resonator having a temperature compensating layer and an integrated frame, according to representative embodiments.

For example, FIG. 7 is a cross-sectional diagram illustrating an acoustic resonator, according to a representative embodiment, which includes a frame composite electrode as a top electrode and a tempco composite electrode as a bottom electrode. More particularly, FBAR 700 includes a resonator stack comprising a first or bottom electrode 720, a piezoelectric layer 130, and a second or top electrode 740 stacked over substrate 110 having a cavity 115 for reflection of acoustic waves. In various alternative configurations, the FBAR 700 may include a known mirror, such as a Bragg mirror (not shown), in place of the cavity 115, as mentioned above. In the depicted embodiment, the bottom electrode 720 is a tempco composite electrode in that it includes temperature compensation features, while the top electrode 740 is a frame composite electrode in that includes integrated lateral features. The top electrode 740 is substantially the same as the top electrode 640 in FBARs 600A and 600B discussed above. Therefore, details regarding the configuration and formation of the bottom electrode 720 will not be repeated. It is understood that the top electrode 740 may have any frame composite electrode configuration, such as the configurations of top electrodes 140, 340, 440, and 540, without departing from the scope of the present teachings.

The bottom electrode 720 has multiple electrode layers, including outside electrode layer 726, temperature compensating layer 727 and interposer layer 729 stacked in this order on the substrate 110. The interposer layer 729 separates the temperature compensating layer 727 from the piezoelectric layer 130. Although the presence of the interposer layer 729 is not necessary, it facilitates proper growth of the piezoelectric layer 130 and otherwise provides protection of the temperature compensating layer 727 during the fabrication process. Also, for purposes of illustration, the temperature compensating layer 727 is shown as an encapsulated temperature compensating layer, similar to the encapsulated temperature compensating layer 227 discussed above with reference to FIG. 2. However, it is understood that in alternative configurations, the temperature compensating layer 727 may not be encapsulated, or only partially encapsulated, within the bottom electrode 720, without departing from the scope of the present teachings.

The outside electrode layer 726 may be formed by applying a layer of the second material (e.g., Mo) to a top surface of the substrate 110 and the cavity 115 (before releasing sacrificial material initially filling the cavity 115) using a sputtering, evaporation or CVD technique, for example, to the desired thickness. The temperature compensating layer 727, the interposer layer 729 are formed on the outside electrode layer 726, and the piezoelectric layer 130 is formed on the interposer layer 729 as discussed above with reference to FIG. 1A and/or FIG. 2, for example. Of course, various other techniques may be incorporated, as would be apparent to one of ordinary skill in the art.

Figure 8A:
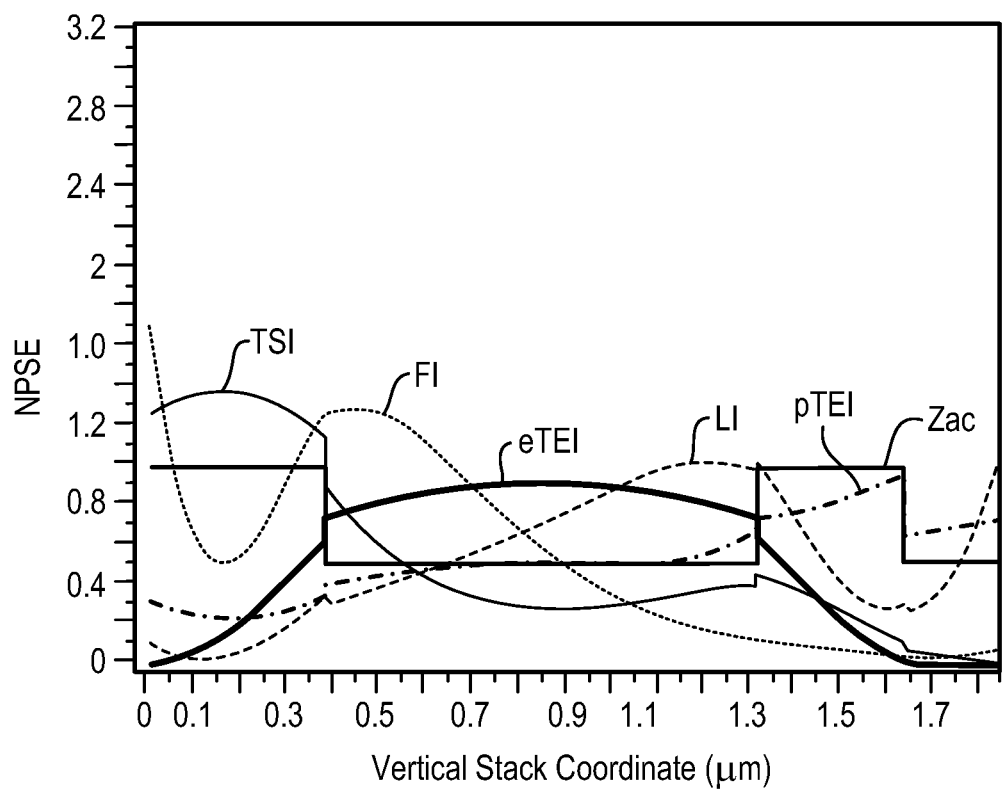
FIGS. 8A-8B are graphs depicting Normalized Peak Strain Energy (NPSE) distributions of the first five modes for an FBAR having no tempco composite electrode and a tempco composite electrode, respectively, for comparison purposes.
Figure 8B:
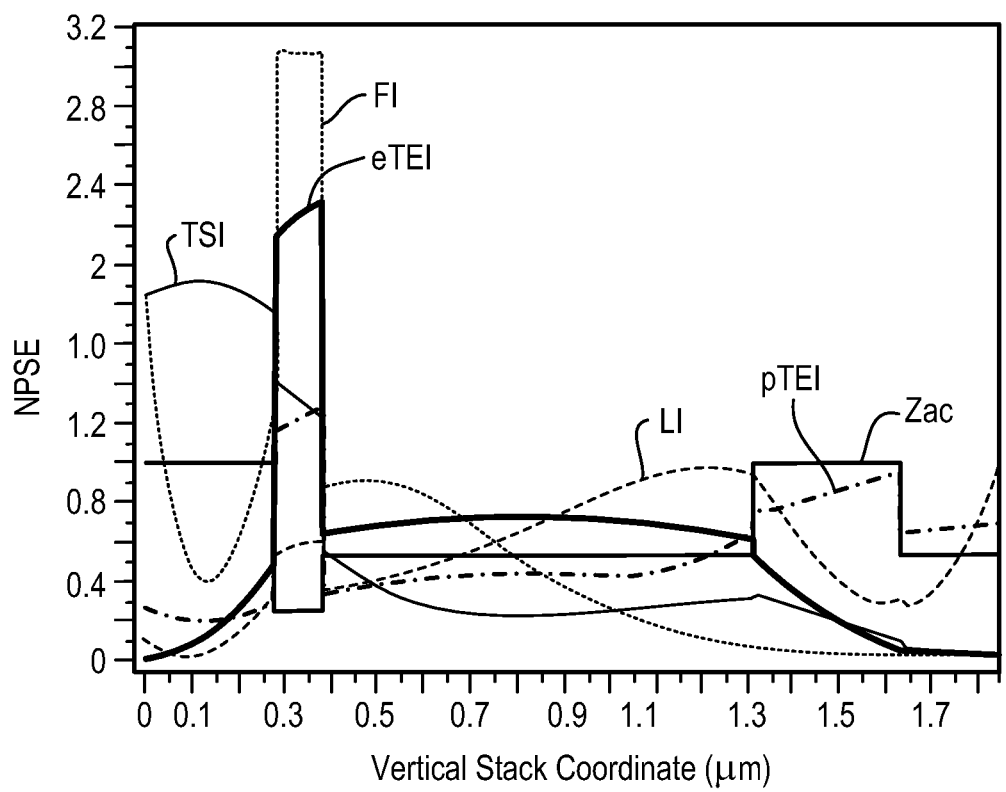

FIG. 8A is a graph depicting Normalized Peak Strain Energy (NPSE) distributions of the first five modes (evanescent and propagating) for an FBAR having a top frame composite electrode and no tempco composite electrode, and FIG. 8B is a graph depicting NPSE distributions of the first five modes for an FBAR having a top frame composite electrode and a bottom tempco composite electrode (e.g., FBAR 700 shown in FIG. 7). In both FIGS. 8A and 8B, the top frame composite electrode is formed using Al as the first material and Mo as the second material, where Al has comparable sound velocity with Mo but approximately 30 percent lower acoustic impedance. As Mason model calculations indicate, such a structure forms a weak low-velocity frame as compared, for example, to the main resonator stack of FBAR 700. The reason for this behavior is that the low impedance Al allows for more energy to penetrate through both the Al layer forming the frame and the top Mo layer, making the Al layer and top Mo layer contributions to the total sound velocity of the resonator stack larger. Since sound velocity of the Al and Mo layers is approximately 40 percent lower than the sound velocity in AlN, the increased contribution to sound velocity from the Al layer and top Mo layer lowers the overall sound velocity in the resonator stack, effectively creating a low velocity frame. Notably, in a typical add-on frame configuration, where a layer of material is simply added in the frame region, the effective low velocity is obtained by increasing the round-trip path of a sound wave between the bottom and the top of the resonator stack. In contrast, in the integrated composite frame described above, the effective low velocity of the resonator stack is obtained by increasing contributions of from lower-velocity Mo and Al layers to the weighted sum of all velocities from materials comprising the resonator stack in the integrated composite frame region.

The five modes lowest order modes that are supported by the stack for frequencies above the cutoff frequency include evanescent thickness extensional mode (denoted as eTE1), propagating thickness extensional mode (denoted as pTE1), thickness sheer (denoted as TS1) mode, dilatational mode (denoted as L1) and flexural mode (denoted as F1). The five modes are calculated at respective series resonance frequencies Fs+30 MHz which corresponds to a frequency approximately halfway between series resonance frequency Fs and parallel resonance frequency Fp. Zac indicates acoustic impedance normalized to acoustic impedance of the Mo layer (the highest in the resonator stack), and is used in FIGS. 8A and 8B to mark positions in the resonator stack. For example, referring to the Zac trace in FIG. 8A, it is apparent that the bottom Mo electrode extends from 0 to approximately 0.4 µm, the AlN piezoelectric layer extends from approximately 0.4 µm to approximately 1.3 µm, the top Mo layer extends from approximately 1.3 µm to approximately 1.65 µm, and the AlN passivation layer extends from approximately 1.65 µm to approximately 1.85 µm. The difference between the resonator stacks shown in FIG. 8A and FIG. 8B is that in FIG. 8B, an approximately 1000 Å thick temperature compensating layer is added below the AlN piezoelectric layer and extends from about 0.3 µm to about 0.4 µm in the resonator stack.

The "low-frequency" integrated frames in the top frame composite electrode lower the electrically excited piston mode amplitude in the frame region around the parallel resonant frequency Fp, thus lowering scattering at the edge of the top frame composite electrode. In addition, integrated frames with optimized width suppress propagating modes excited at the interface of the integrated frame and the membrane located in the central portion of the FBAR.

However, effectiveness of the integrated frame generally depends on overlap of given eigenmodes with the integrated frame.

As shown in FIG. 8A, the integrated frames placed in the top frame composite electrode (above the piezoelectric layer) interact most effectively with the pTE1 and L1 modes (confined to the top of the resonator stack), and less effectively with the TS1 and F1 modes (confined to the bottom of the stack). On the other hand, integrated frames placed in the bottom frames composite electrodes interact most effectively with the TS1 and F1 modes (confined to the bottom of the resonator stack), and less effectively with the pTE1 and L1 modes (confined to the top of the stack). Thus the benefit of using integrated frames is that they can be placed at the location in the resonator stack that provides maximum benefit for suppression of spurious lateral modes.

Referring to FIG. KB, low impedance of the temperature compensating layer (e.g., temperature compensating layer 727) in the bottom tempco composite electrode shifts the NPSE for the TS1 and F1 modes even further towards bottom of the resonator stack, making integrated frames in the top frame composite electrode even less efficient in suppressing these modes. Depending on design requirements, the performance improvement provided by the top frames (either integrated or add-on frames) may not be sufficient in resonators and filters with temperature compensating layers. Thus, integrated frames may be included in the bottom electrode (e.g., as shown in FIGS. 6A and 6B) to suppress the TS1 and F1 modes. Since these integrated frames are essentially planar, they will enable growth of high quality piezoelectric material on top of them. The decision whether to use integrated frames in top, bottom, or both electrodes may be made based on overall cost/performance considerations, as adding integrated frames in different locations may improve the quality factor Q of the resonator, but it may also increase the total cost of the filter comprising of temperature compensated resonators.

Figure 9:
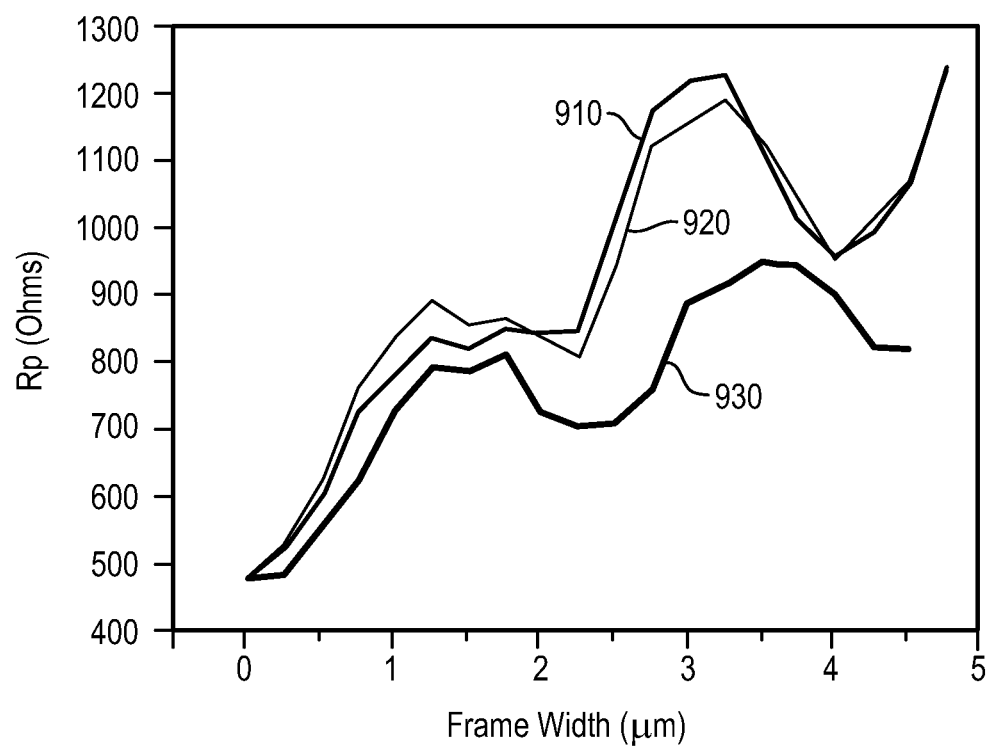
FIG. 9 is a graph illustrating parallel resistance Rp versus frame width of integrated low velocity frames having various thicknesses in an FBAR with a top frame composite electrode and a bottom tempco composite electrode, according to representative embodiments.

FIG. 9 is a graph illustrating simulated parallel resistance Rp (ohms) versus frame width (μm) of integrated low velocity frames having various thicknesses in an FBAR with a top frame composite electrode and a bottom tempco composite electrode (e.g., FBAR 700 shown in FIG. 7), according to representative embodiments. Generally, parallel resistance Rp is a function of integrated frame width. In the depicted example, the integrated low velocity frame is made of Al as the first material and Mo as the second material, where Al has comparable sound velocity to Mo, but has approximately 30 percent lower acoustic impedance. As explained above, such a resonator stack design effectively yields a low velocity frame. Trace 910 depicts the integrated low velocity frame with a thickness of about 0.5 kÅ, trace 920 depicts the integrated low velocity frame with a thickness of about 1 kÅ, and trace 930 depicts the integrated low velocity frame with a thickness of about 2 kÅ. The thicknesses of the layers in the resonator stack otherwise remain the same. For example, the bottom tempco composite electrode has an outside electrode layer formed of Mo, and a temperature compensating layer formed of BSG having a thickness of about 500 Å. In this example, the interposer layer (e.g., interposer layer 729 shown in FIG. 7) is omitted to simplify the calculations. The bottom electrode has an overall thickness of about 3.3 kÅ. The piezoelectric layer is formed of AlN and has a thickness of about 9.3 kÅ. The top frame composite electrode is formed of Mo with an integrated low velocity frame formed of Al, as mentioned above. The top frame composite electrode has an overall thickness of about 3.25 kÅ, while the thickness of the integrated low velocity frame varies. A passivation layer formed of AlN is formed over the top frame composite electrode at a thickness of about 2 kÅ. Note that the NPSE distributions for eigenmodes supported by this resonator stack without the composite frames are very similar to NPSE distributions shown in FIG. 8B (where the BSG layer has a thickness of about 1 kÅ).

Traces 910-930 indicate that parallel resistance Rp is a periodic function of the thickness of the integrated low velocity frame, as expected. Generally, the thinner integrated low velocity frames yield better peak parallel resistance Rp improvement at each frame width. The best simulated parallel resistance Rp improvement shown in FIG. 9 represents about 2.5 times improvement (from about 500 ohms to about 1200 ohms) for a 3 μm wide integrated low velocity frame, indicated by trace 910.

It is understood that the specific configurations of the FBARs 100A to 700 and related embodiments discussed above are illustrative, and that the various parameters and characteristics described herein may vary to provide unique benefits for any particular situation or to meet application specific design requirements. Further, various alternative combinations of integrated low velocity and high velocity frames may be incorporated, without departing from the scope of the present teachings.

In addition, although each of the representative integrated low velocity frames discussed above has a rectangular cross-sectional shape, it is understood that they may include other cross-section shapes and/or may include multiple lateral interfaces within the composite electrode, such as stepped structures. Examples of frames having multiple lateral interfaces are included in U.S. patent application Ser. No. 13/232,334, to Burak et al., filed Sep. 14, 2011, which is hereby incorporated by reference in its entirety. The multiple lateral interfaces may provide improved selected mode confinement and/or suppression.

Notably, the teachings of the incorporated patents and patent applications are intended to be illustrative of methods, materials and structures useful to the present teachings, but in no way limiting to the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A bulk acoustic wave (BAW) resonator device, comprising:
a lower electrode disposed over a substrate over one of a cavity and an acoustic mirror;
a piezoelectric layer on the lower electrode; and
an upper electrode disposed over the piezoelectric layer, at least one of the lower electrode and the upper electrode being a hybrid electrode comprising a temperature compensating layer having a positive temperature coefficient for offsetting at least a portion of a negative temperature coefficient of the piezoelectric layer, and an integrated frame configured to create at least one of a cut-off frequency mismatch and an acoustic impedance mismatch, wherein the hybrid electrode comprises an outside electrode layer, an inside electrode layer and an interposer layer, the temperature compensating layer being formed between the inside electrode layer and the interposer layer and the interposer layer being formed between the temperature compensating layer and the piezoelectric layer.

2. The BAW resonator device of claim 1, wherein the integrated frame comprises an integrated low velocity frame formed by a first material located at an outer region of the hybrid electrode and an inner portion formed by a second material located at a center region of the hybrid electrode, the first material having a lower sound velocity than the second material.

3. The BAW resonator device of claim 1, wherein the integrated frame comprises an integrated high velocity frame formed by a second material located at an outer region of the hybrid electrode and an inner portion formed by a first material located at a center region of the hybrid electrode, the first material having a lower sound velocity than the second material.

4. The BAW resonator device of claim 1, wherein the lower electrode comprises the hybrid electrode and the upper electrode comprises a frame electrode having an integrated frame.

5. The BAW resonator device of claim 1, wherein the upper electrode comprises the hybrid electrode and the lower electrode comprises a frame electrode having an integrated frame.

6. The BAW resonator of claim 1, further comprising a cavity disposed in the substrate, over which the lower electrode is disposed.

7. The BAW resonator of claim 1, further comprising a Bragg mirror disposed beneath the lower electrode.

* * * * *